(12) United States Patent
Takahashi et al.

(10) Patent No.: US 6,552,915 B2
(45) Date of Patent: Apr. 22, 2003

(54) COMMUNICATIONS APPARATUS AND PLUG-IN UNIT

(75) Inventors: Tsutomu Takahashi, Kawasaki (JP); Hisao Hayashi, Kawasaki (JP); Mitsuo Kaetsu, Kawasaki (JP); Shiro Tani, Kawasaki (JP); Hideki Zenitani, Yokohama (JP); Kouichi Namimatsu, Fukuoka (JP); Masato Konishi, Kawasaki (JP)

(73) Assignees: Fujitsu Limited, Kawasaki (JP); Fujitsu Denso Limited, Kawasaki (JP)

( * ) Notice: Subject to any disclaimer, the term of this patent is extended or adjusted under 35 U.S.C. 154(b) by 0 days.

(21) Appl. No.: 09/944,494

(22) Filed: Aug. 30, 2001

(65) Prior Publication Data

US 2002/0006026 A1 Jan. 17, 2002

Related U.S. Application Data

(63) Continuation of application No. PCT/JP99/02892, filed on May 31, 1999.

(51) Int. Cl.⁷ .............................. H05K 7/14; H05K 7/18
(52) U.S. Cl. ....................... 361/796; 361/752; 361/753; 361/756
(58) Field of Search .................................. 361/800, 816, 361/818, 737, 752, 753, 796, 803, 802, 756

(56) References Cited

U.S. PATENT DOCUMENTS

| 5,617,296 A | * | 4/1997 | Melville et al. ............. 361/729 |
| 5,929,377 A | * | 7/1999 | Hamilton et al. ......... 174/35 R |
| 6,058,025 A | * | 5/2000 | Ecker et al. ............... 174/35 R |

FOREIGN PATENT DOCUMENTS

| JP | 63-156398 | 6/1988 |
| JP | 5-243762 | 9/1993 |
| JP | 9-6468 | 1/1997 |
| JP | 9-18183 | 1/1997 |
| JP | 9-181468 | 7/1997 |
| WO | 00/74454 A1 | 12/2000 |

* cited by examiner

*Primary Examiner*—David Martin
*Assistant Examiner*—Thanh Yen Thanh
(74) *Attorney, Agent, or Firm*—Katten Muchin Zavis Rosenman

(57) ABSTRACT

A telecommunications apparatus 10 includes a sub-rack unit 15 and a plurality of plug-in units inserted from a front side of the sub-rack unit 15 in a Y1 direction and mounted in the sub-rack unit 15. The plug-in unit 16 includes a plug-in unit main body and an aluminum case 41 that covers so as to envelope the plug-in unit main body. An intermediate guide rail member 22 is inserted from the front of the sub-rack unit 15 and mounted by tightening a lock bolt member similarly inserted from the front of the sub-rack unit 13.

21 Claims, 26 Drawing Sheets

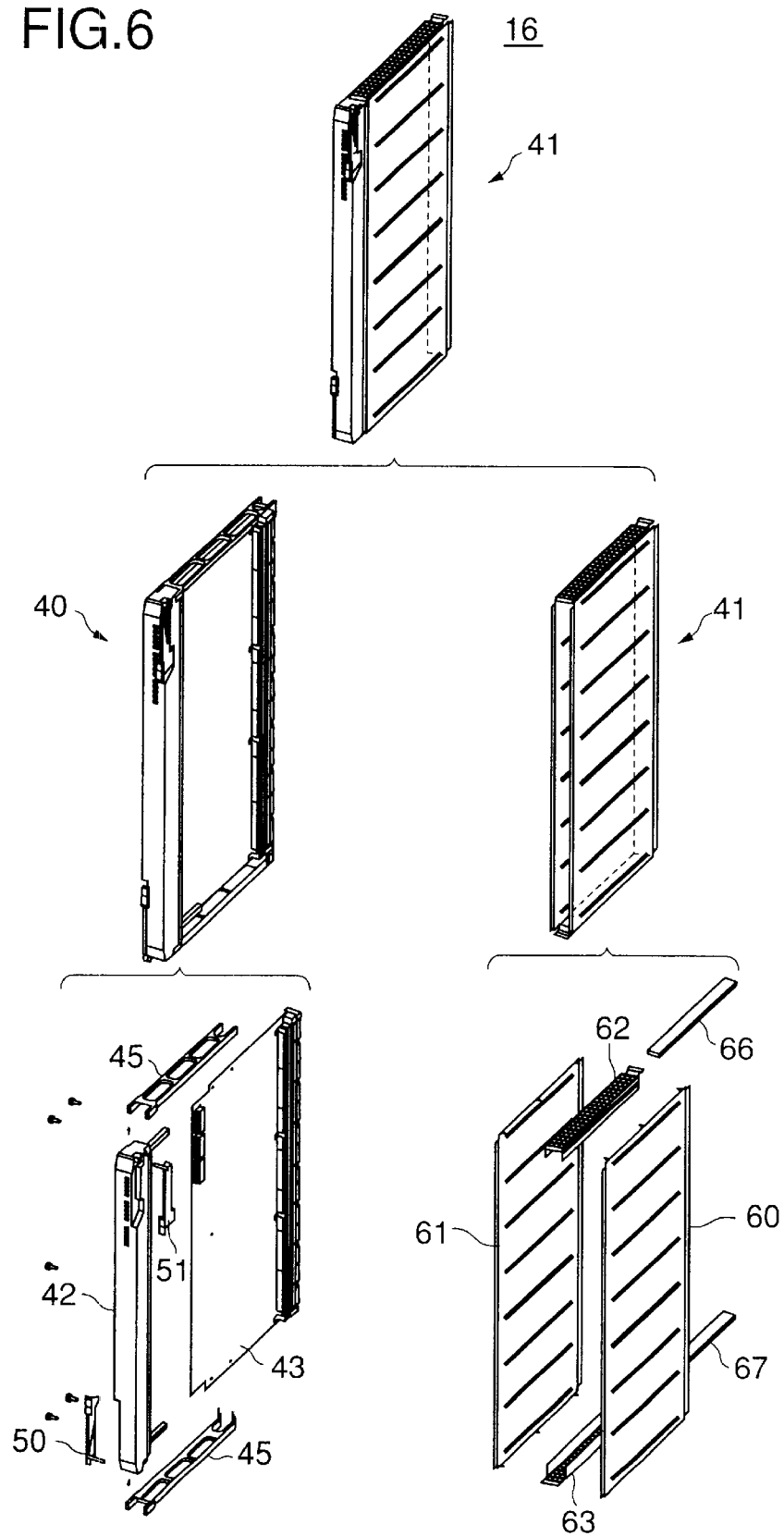

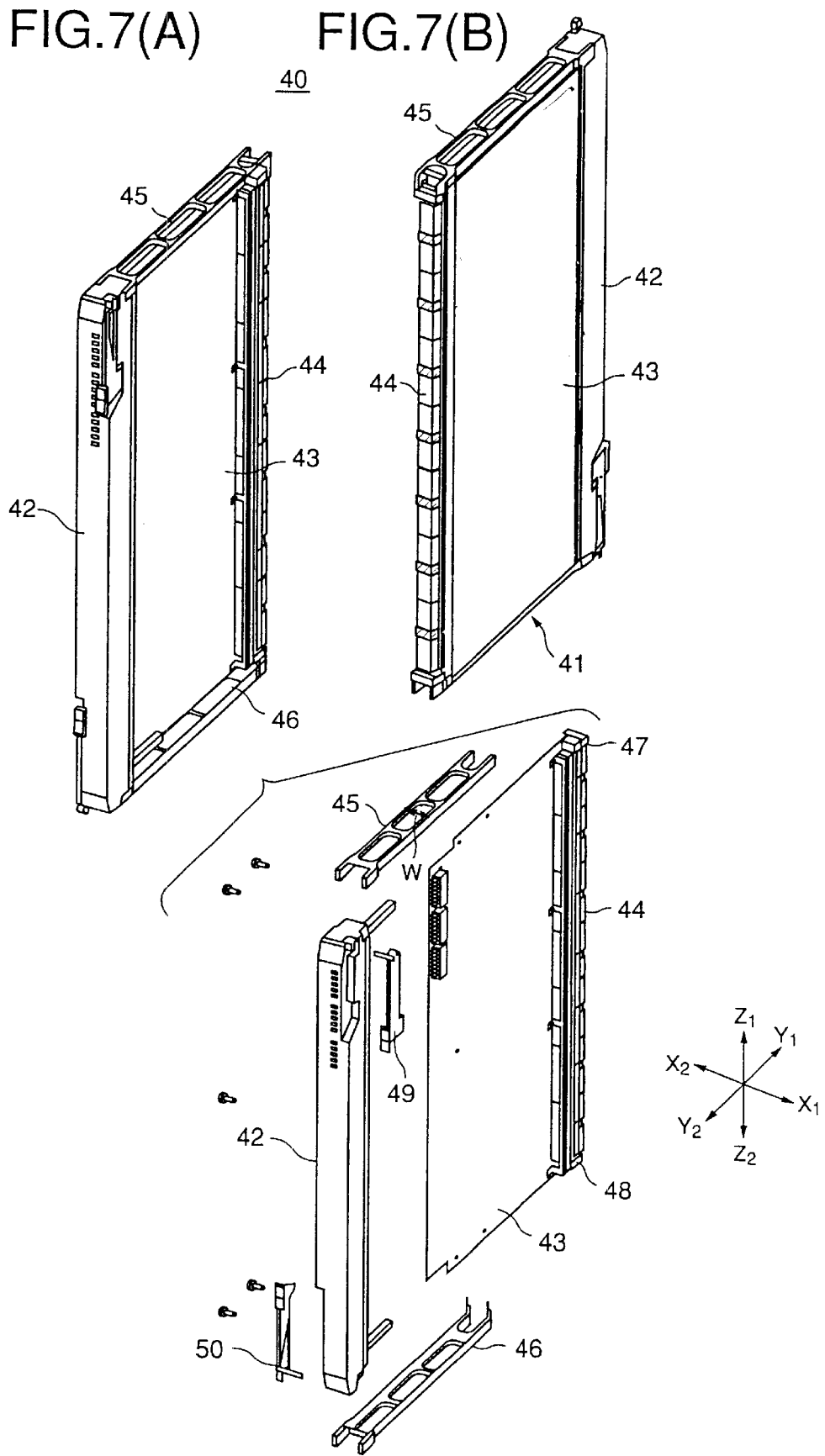

FIG.10 (A)
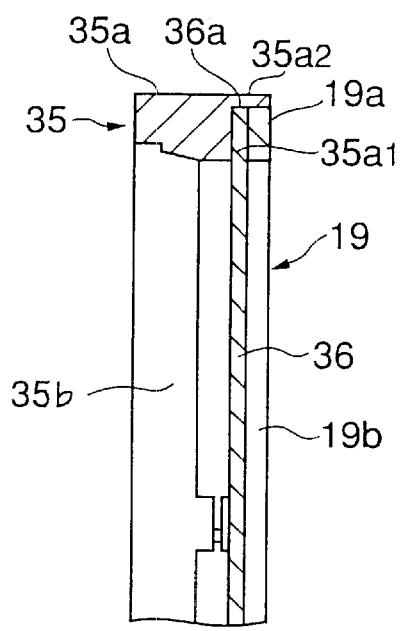
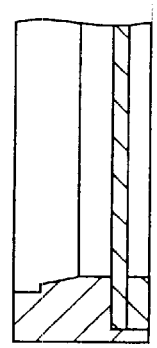
FIG.10 (B)
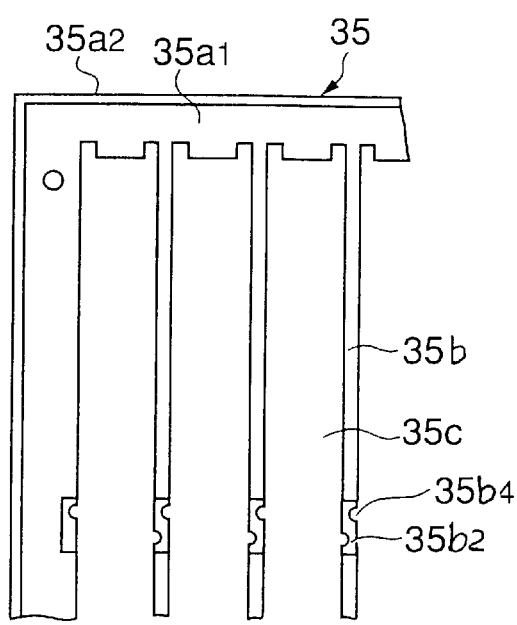
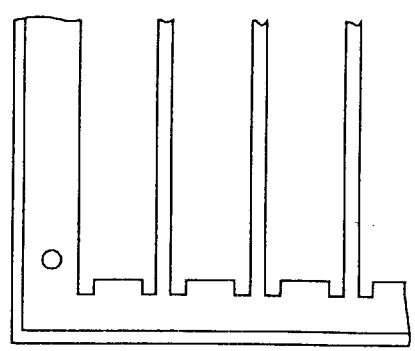
Y2 ← → Y1

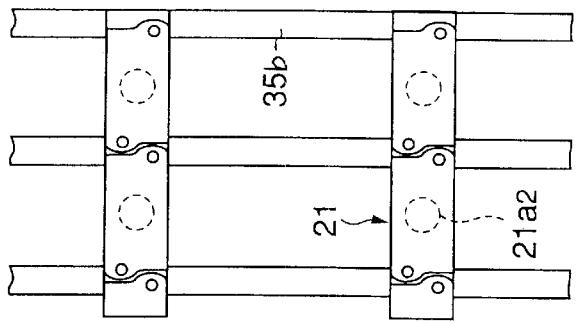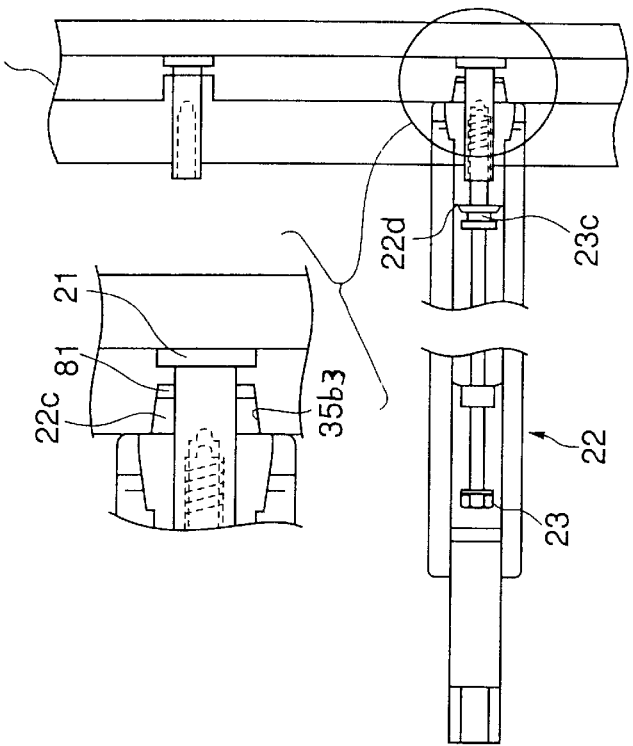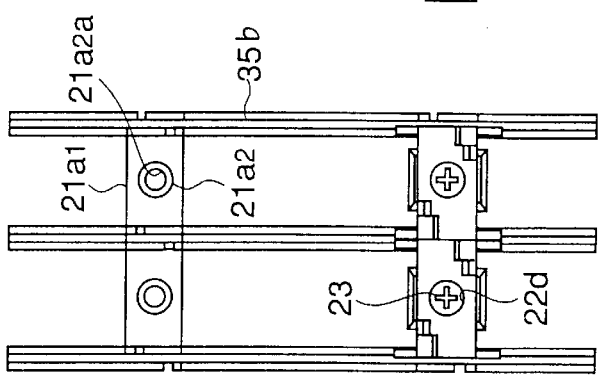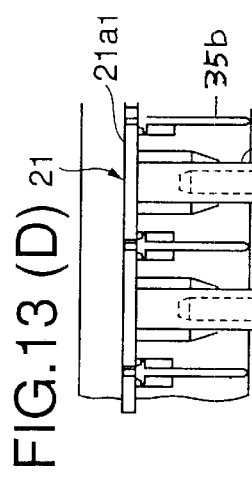

FIG.25
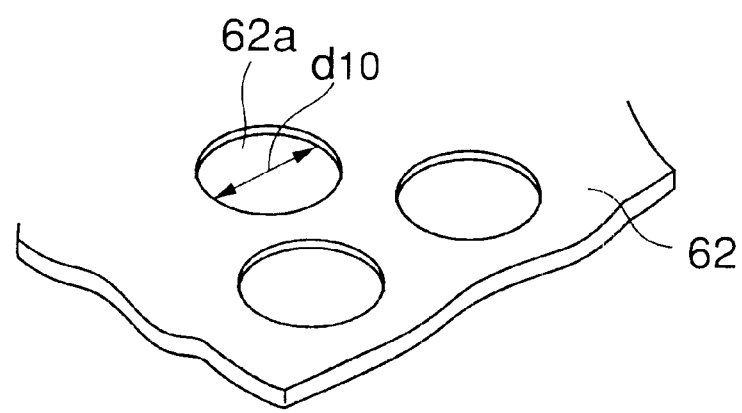
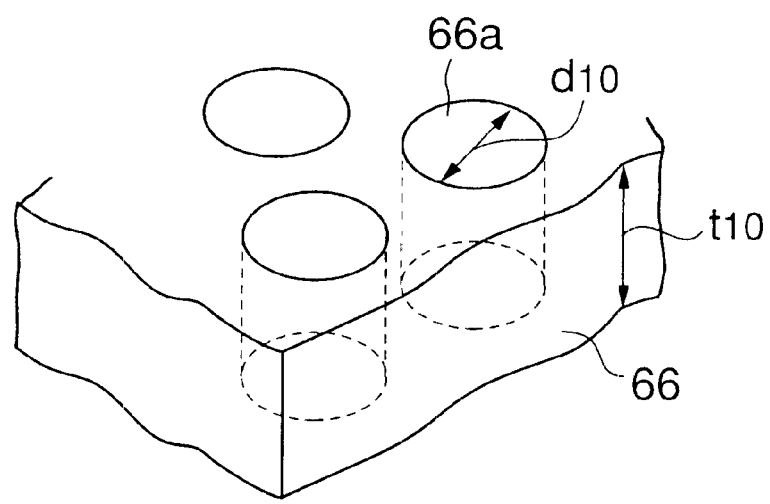

COMMUNICATIONS APPARATUS AND PLUG-IN UNIT

This application is a continuation of international application number PCT/JP99/02892, filed May 31, 1999.

TECHNICAL FIELD

The present invention relates to a telecommunications apparatus, and more particularly, to a telecommunications apparatus of a type typically used in telecommunications stations and having reduced electromagnetic interference (EMI) radiation, improved flame resistance and improved ease of expansion.

Together with the growing importance of telecommunications in recent years there is a growing need for improvements in the quality of the telecommunications equipment used in exchanges and the like. One such improvement in quality has to do with lowering the amount of EMI radiated from such equipment, done for example by meeting the FCC standards embodied in Part 18 of the FCC regulations and adopted in North America, and additionally, by having flame resistance such that a fire does not spread if for example one breaks out within the telecommunications equipment.

Additionally, though not directly related to essential performance of the telecommunications equipment, users do value an ability to accommodate changes in future telecommunications operations, such as an increase in telecommunication lines, that is, ease of expansion.

BACKGROUND ART

Generally, such telecommunications equipment consists of a plurality of plug-in units aligned within a sub-rack which is mounted in a rack.

A cover provided on the front of the sub-rack into which the plug-in units are inserted in order to reduce EMI emissions is the EMI countermeasure conventionally adopted. This construction is designed to shield the electromagnetic interference radiated from the loaded plug-in unit. However, with this construction, there was a danger that the EMI countermeasures would be insufficient.

As for flame resistance, conventionally the approach taken has been a metallic plate member provided opposite a printed circuit board of the plug-in unit. In this composition, a peripheral portion of the printed circuit board was exposed directly to the flame, so there was a danger that the fire would spread and thus flame resistance was insufficient.

With respect to ease of expansion, consider a case in which a loaded plug-in unit of normal height is removed and in its place two plug-in units of half the normal height are loaded. Conventionally, vertical as well as horizontal partitions are mounted inside the sub-rack, partitioning a portion of the interior of the sub-rack in two, and then plug-in units of half the normal height are inserted, expanding capacity. The vertical partitions have the function of supporting the horizontal partitions at one edge. In this construction, the operation of mounting the partitions is troublesome, and further, it is difficult to precisely position the partitions so as to form a space in which a single plug-in unit is contained, and so it was not easy to perform an expansion.

DISCLOSURE OF THE INVENTION

The present invention has as its overall object to provide a telecommunications apparatus that solves the above-described problems of the conventional art.

A more specific object of the present invention is to provide a telecommunications apparatus that satisfactorily lowers electromagnetic interference radiated to the outside from the telecommunications apparatus and that has fire resistance such that a fire does not spread even if one breaks out inside the telecommunications apparatus.

In order to achieve these objects, the present invention provides a telecommunications apparatus comprising a box-like sub-rack unit having a back wiring board and a guide rail portion and a plurality of plug-in units inserted and loaded into the sub-rack unit from a front surface thereof along the guide rail portion, the sub-rack unit configured so as to have a back wiring board frame plate having ribs provided on a front of the back wiring board, the plug-in unit comprising:
a metallic front member;
a printed board fixedly mounted at one edge on the front member and having, at a leading edge in a direction of insertion, a connector designed to be connected to the back wiring board when loaded; and
a metallic case that envelopes the printed board and has an opening on a leading edge in a direction of insertion that exposes the connector, the plug-in unit configured so that an entire peripheral edge of the opening on the leading edge in the direction of insertion of the metal case contacts the back wiring board frame plate ribs in a state in which the plug-in unit is mounted in the sub-rack unit.

According to this type of telecommunications apparatus, by having the metallic case cover and envelope the printed board, the radiation of electromagnetic interference outward from the mounted individual plug-in units can be limited. Accordingly, it is possible to satisfactorily lower the electromagnetic. interference radiated to the outside from the telecommunications apparatus. Additionally, by having the metallic case cover and envelope the printed board, flames from a fire can be checked from reaching the printed board so that the fire does not spread.

Another object of the present invention is to provide a telecommunications apparatus designed for ease of expansion.

In order to achieve these objects, the present invention provides a sub-rack unit comprising:

a lock nut member mounted so as to straddle rear surfaces of adjacent ribs on the back wiring board frame plate and having a lock nut that projects proximally; and an intermediate guide rail member having guide rails on upper and lower surfaces with a lock bolt member retained inside and an opening in which a tool is inserted so as to rotate the lock bolt member, the intermediate guide rail member being inserted into the sub-rack unit from a front surface thereof and mounted by similarly threading the lock bolt member into the lock nut of the lock nut member from the sub-rack unit front surface.

The operation of mounting the intermediate guide rail is possible entirely from the front of the sub-rack unit. Accordingly, the operation of mounting the intermediate guide rail member is easy, and expansion can also be done easily.

These and other objects, features and advantages of the present invention will become more apparent from the following detailed description with reference to the accompanying drawings.

BRIEF DESCRIPTION OF THE DRAWINGS

FIG. 6 is a diagram showing a construction of the plug-in unit.

FIG. 7 is a diagram showing a construction of a main body of a plug-in unit.

FIG. 10 is a diagram showing a back wiring board mounting portion.

FIG. 13 is a diagram showing a mounting state of an intermediate guide rail member.

FIG. 25 is a diagram showing an expanded view of a relation between the cover plate and an electromagnetic wave emissions restriction filter.

PREFERRED EMBODIMENTS FOR WORKING THE INVENTION

Figure 1:
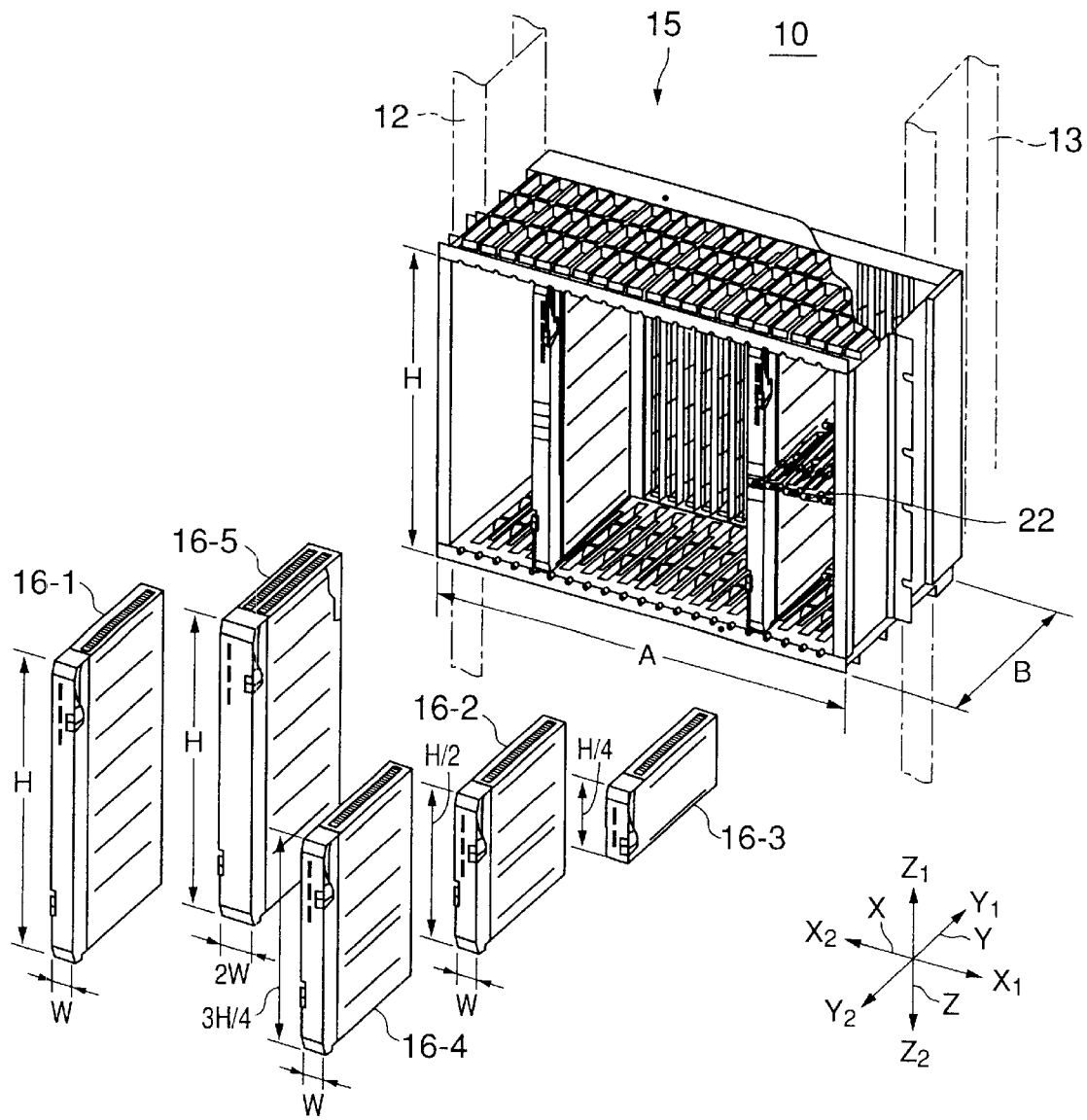
FIG. 1 is a partial exploded perspective view of a telecommunications apparatus 10 according to one embodiment of the present invention, in which some of the plug-in units are shown positioned outside the sub-rack unit 15.
Figure 3:
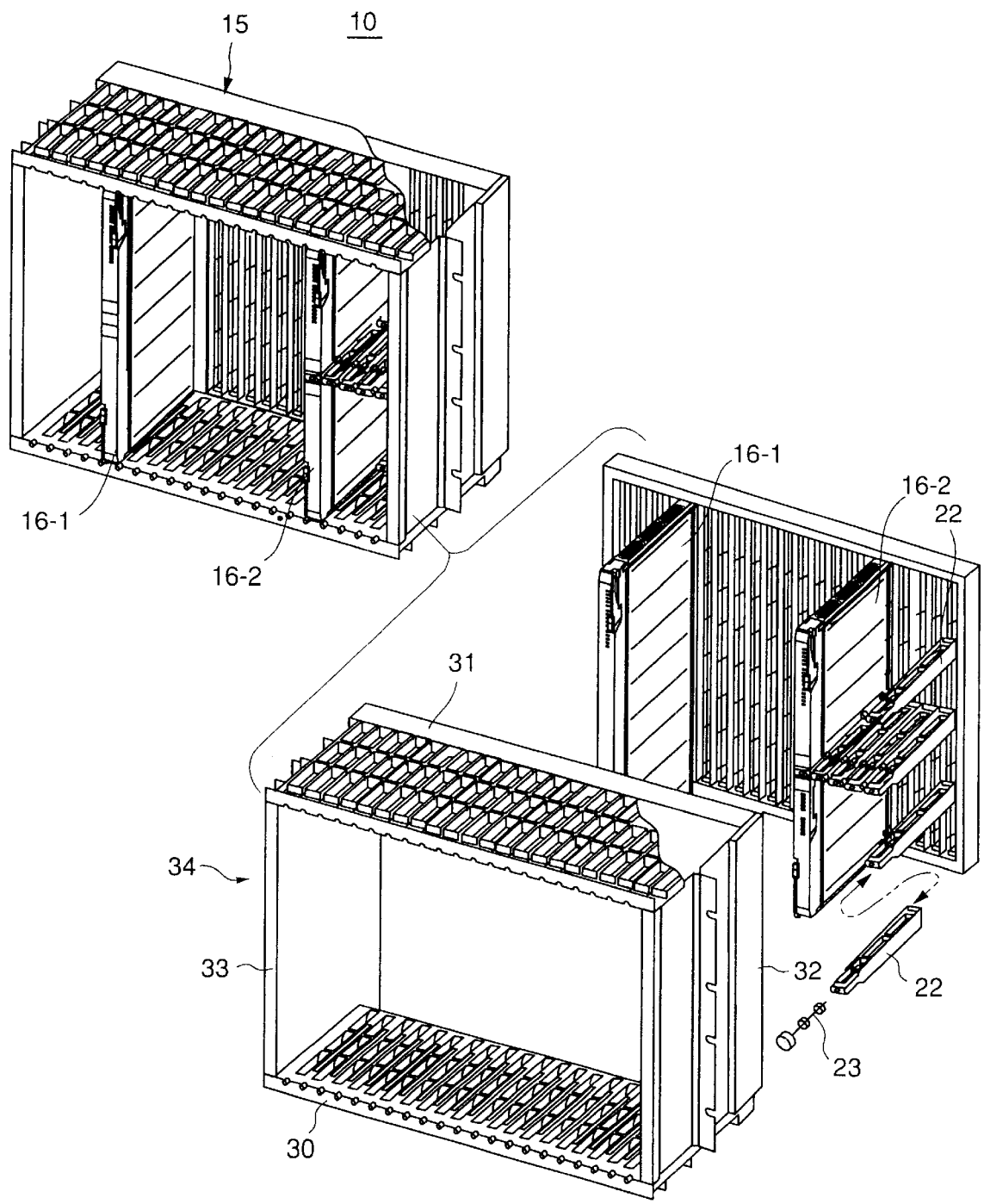
FIG. 3 is a partial exploded perspective view of the telecommunications apparatus 10 of FIG. 1.

FIG. 1 is a perspective view of a telecommunications apparatus 10 according to one embodiment of the present invention, in which some of the plug-in units 16 are shown positioned outside the sub-rack unit 15, and FIG. 3 is a partial exploded perspective view of the telecommunications apparatus 10. The telecommunications apparatus 10 rack 11 is mounted to left and right racks 12, 13 and installed inside a telecommunications station. An X axis is a direction in a width of the telecommunications apparatus 10, a Y axis is in a depth direction and a Z axis is in a height direction.

It should be noted that the portions that correspond to the individual compositional components of the telecommunications apparatus 10 are not perfectly identical. However, for convenience of illustration a description is given using the same reference symbols W, H.

[Brief Description of the Construction of Telecommunications Apparatus 10]

The telecommunications apparatus 10 is composed of a sub-rack unit 15 and a plurality of plug-in units 16 inserted and mounted from the Y1 direction and aligned along the direction of the X axis, having a height H, a width A and a depth B.

The plug-in units 16 are of a plurality of types, for example, full-height plug-in units 16-1 of a height corresponding to a height H of the sub-rack unit 15, half-height plug-in units 16-2, quarter-height plug-in units 16-3 and three-quarter height plug-in units 16-4. There are also cases in which a double-width plug-in unit 16-5 is mounted as well.

Figure 2A:
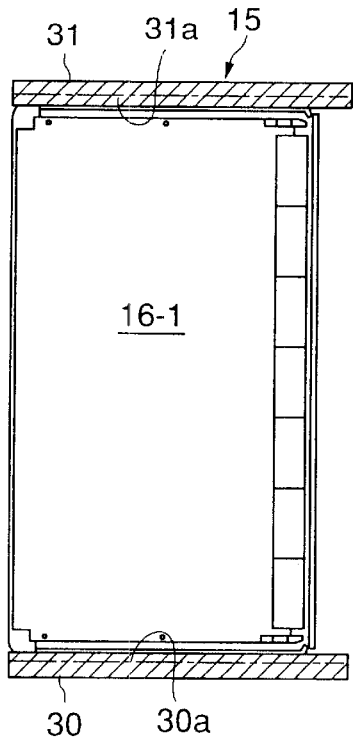
FIG. 2 is a diagram showing different types of plug-in units in an installed state.
Figure 2B:
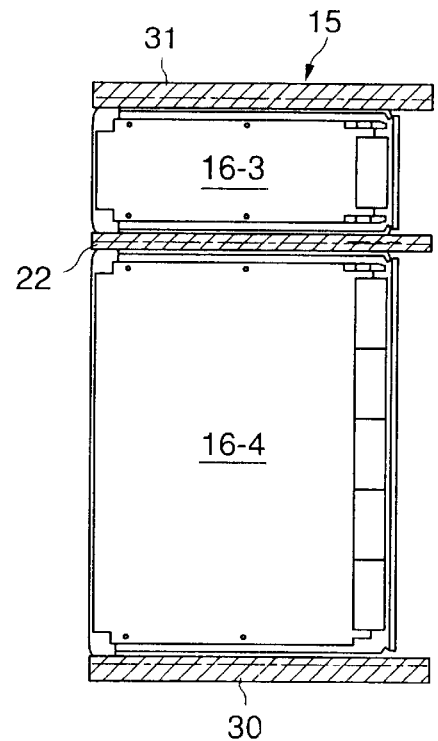
Figure 2C:
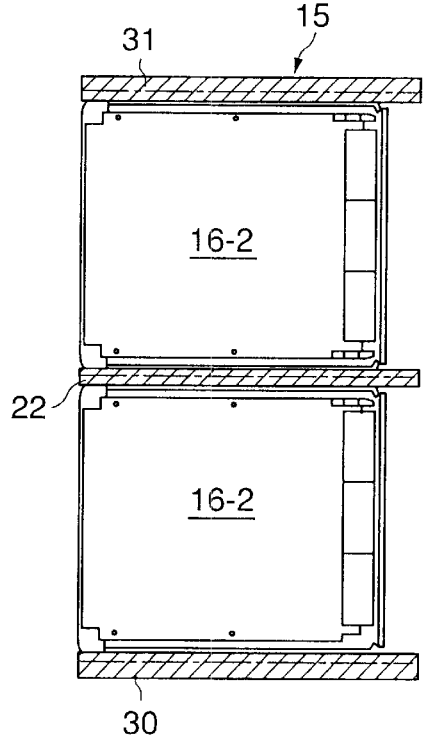
Figure 2D:
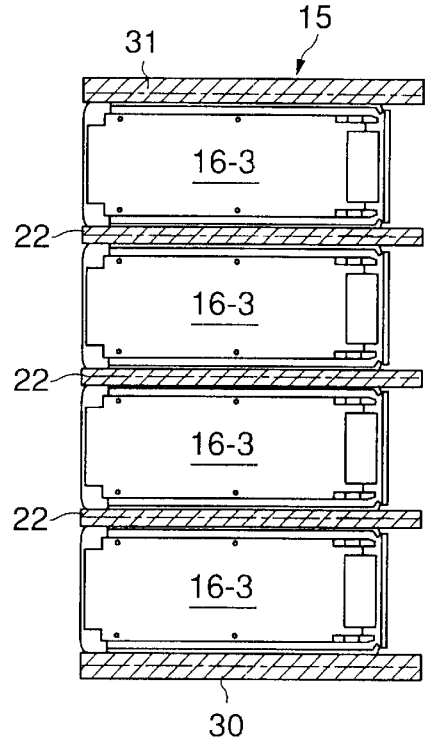

The full-height plug-in unit 16-1 is mounted as shown in FIG. 2(A). The half-height plug-in unit 16-2, quarter-height plug-in unit 16-3 and three-quarter height plug-in unit 16-4 are mounted using an intermediate guide rail member 22 as shown in FIGS. 2(B), 2(C) and 2(D).

[Brief Description of the Construction of Sub-Rack Device 15]

Figure 4:
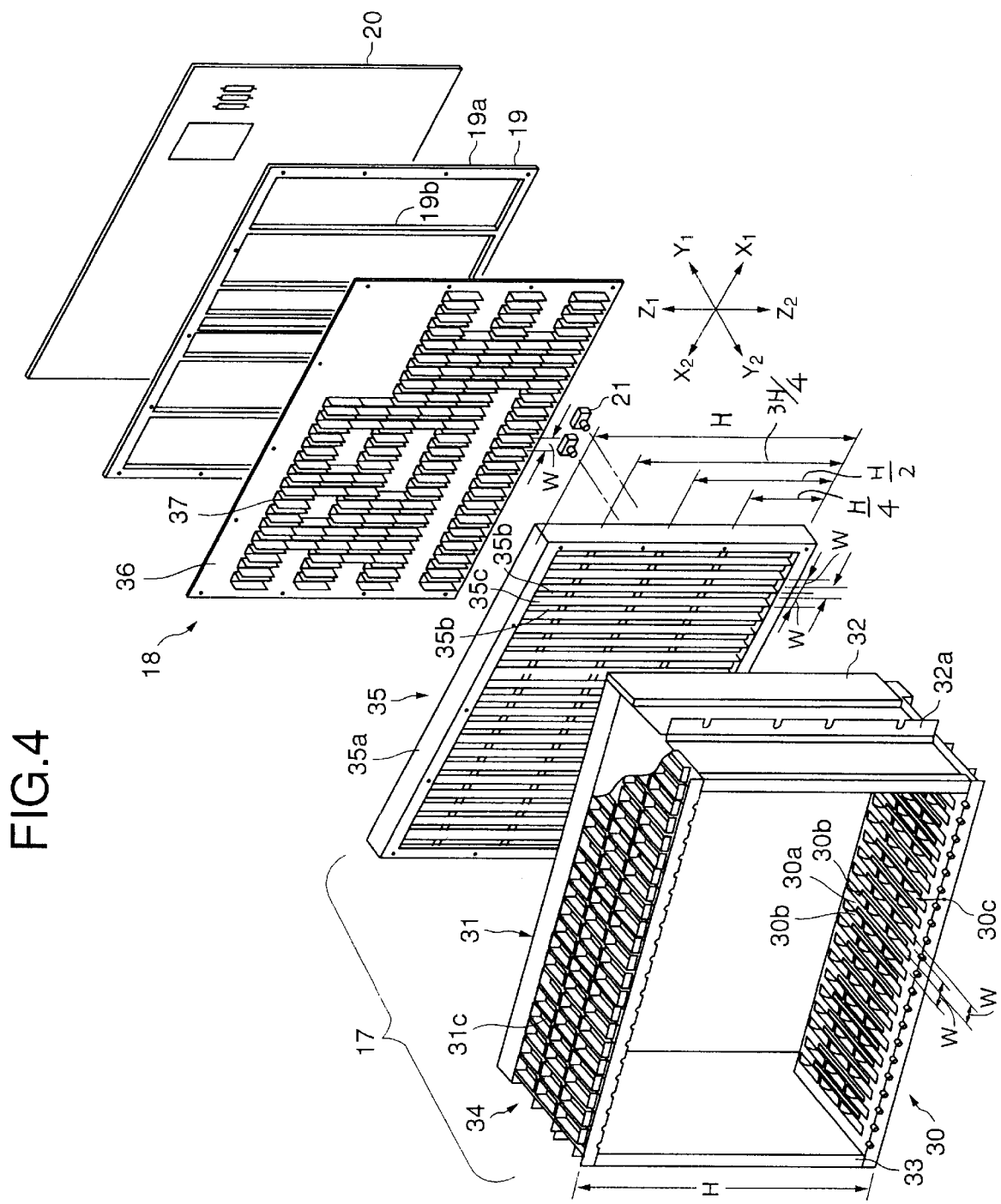
FIG. 4 is a partial exploded perspective view of the sub-rack unit 15 of FIG. 1.

The sub-rack 15, as shown in FIGS. 3 and 4, is of a construction that has sub-rack main unit 17, back wiring board 18, back wiring board warp preventing frame plate 19, back cover 20, lock nut member 21 and the intermediate guide rail member 22.

The sub-rack main unit 17 comprises a quadrilateral box portion 34 and a rear side back wiring board frame plate 35, and has a box-like front opening of a height H, a width A and a depth B. The quadrilateral box portion 34 comprises a bottom panel 30, a top panel 31, a right panel 32, a left panel 33 and the rear side back wiring board frame plate 35.

The lock nut member 21, back wiring board 18, back wiring board warp preventing frame plate 19 and back cover 20 are aligned in that order behind the rear of the sub-rack main unit 17.

Both the bottom panel 30 and the top panel 31 are aluminum die cast construction. Guide rails 30a of width W are aligned in the X direction at a pitch W atop the bottom panel 30. Each guide rail 30a is formed between adjacent ribs 30b. Guide rails 31a are also formed on a bottom surface of the top panel 31 as described above (see FIG. 2). Additionally, a multiplicity of air exchange openings 30c, 31c are located at each guide rail 30b position on the top panel 31 and the bottom panel 30, aligned so as to form a matrix.

The right panel 32 and the left panel 33 are both aluminum extrusion material, with ribs 32a formed on an outer side thereof and used for mounting on the rack 11.

The back wiring board frame plate 35 is aluminum die cast construction, and comprises a quadrilateral frame part 35a and a plurality of ribs 35b extending in the Z1, Z2 direction and aligned in the X1, X2 direction. Slots 35c extending in the Z1, Z2 direction are formed between adjacent ribs 35b. The ribs 35b are aligned at a pitch of approximately dimension W, with the slots 35c also aligned at a pitch of approximately dimension W. The quadrilateral frame part 35a of the back wiring board frame plate 35 is mounted by engaging the inside of the rear surface of the quadrilateral box portion 34. The individual slots 35c match the individual guide rails 30a. The ribs 35b, as will be explained later, are formed for the purpose of mounting the intermediate rail.

The back wiring board 18 comprises a back wiring board main unit 36 and a plurality of connectors 37 mounted on the front surface of the back wiring board main unit 36. The connectors 37 are aligned in the Z1-Z2 direction, in rows extending in the X1, X2 direction at a pitch of dimension W. The back wiring board 18 is mounted on a rear surface of the back wiring board frame plate 35. Each connector 37 is positioned inside the above-described slots 35c, and matches each guide rail 30a.

The back wiring board warp preventing frame plate 19 comprises a frame 19a and a plurality of vertical slats 19b. The back wiring board warp preventing frame plate 19 is mounted on a rear surface of the back wiring board 18.

Peripheral and other portions of the back wiring board 18, the back wiring board warp preventing frame plate 19 and the back cover 20 are together attached by the same screws screwed into the back wiring board frame plate 35 from the rear of the back cover 20. Additionally, a ground pattern formed flush across both surfaces of the back wiring board 18 is electrically connected at a multiplicity of points to the back wiring board frame plate 35 as well as to the back wiring board warp preventing frame plate 19. Accordingly, the ground pattern formed flush across both surfaces of the back wiring board 18 is electrically connected to the ground via the back wiring board frame plate 35 (the back wiring board warp preventing frame plate 19)→sub-rack main unit 17→rack 11, and acquires the frame ground electric potential.

The lock nut member 21 is a member necessary for the mounting of the intermediate guide rail member 22, and is mounted at the required position on the back surface of the back wiring board frame plate 35 so as to not interfere with the back wiring board 18. The required position is the position at which the intermediate guide rail member 22 is presently mounted or will in the future be mounted, and further, and is regularized at heights of H/4, H/2 and H/3.

The intermediate guide rail member 22 is a member necessary to the mounting of the plug-in units 16-2, 16-3, 16-4 in place of the plug-in unit 16-1, and has a top surface, a bottom surface and guide rails 22a, 22b, with a lock bolt member 23 retained internally. The intermediate guide rail member 22 is fixedly mounted at a Y1 edge side to heights of H/4, H/2 and H/3 at the back wiring board frame plate 35 by the lock bolt member 23 being threaded into the lock nut member 21 from the Y2 side, and projects in the Y2 direction. When the plug-in units are expanded for example several years after the telecommunications apparatus 10 has been installed, the intermediate guide rail member 22 can be mounted at that time.

[Brief Description of the Construction of Plug-In Unit 16]

Figure 5A:
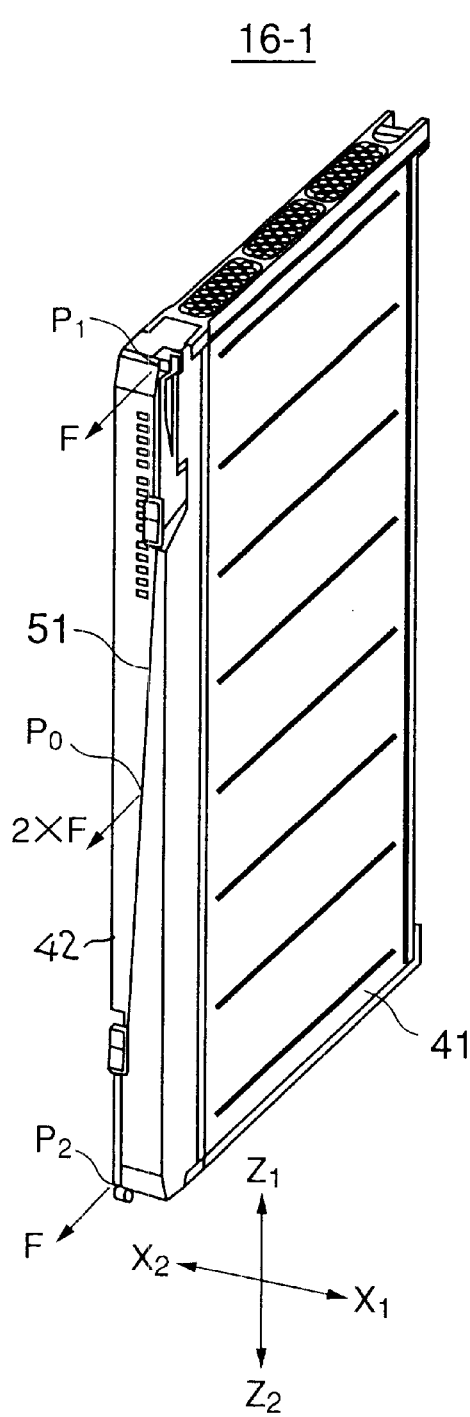
FIG. 5 is a perspective view of a plug-in unit.
Figure 5B:
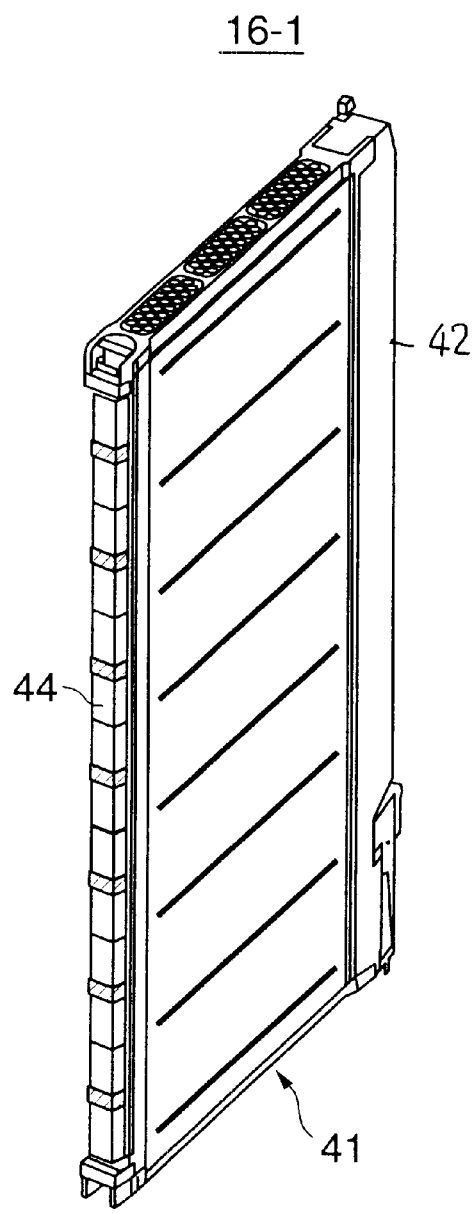

The plug-in unit 16, as shown in FIGS. 5(A) and 5(B) and in FIG. 6, comprises a plug-in unit main body 40 and a case 41 that covers so as to envelope the plug-in unit main body 40.

The plug-in unit main body 40, as shown in FIGS. 7(A) and 7(B) together, comprises an aluminum die cast front member 42; a printed board 43 mounting electronic components (not shown in the diagram) that compose an electronic circuit, a connector 44 mounted along a Y1 edge thereof and the Y2 edge of the printed board 43 being fixedly mounted on the front member 42; case retention/slider members 45, 46, rotatably supported at the Y1 edge on upper and lower sides of the front member 42 so as to extend in the direction of the Y axis along upper and lower sides; case supporting members 47, 48 mounted on a Z1, Z2 edge of the printed board 43 along the Y1 end thereof; and card lever members 49, 50 mounted on the front member 42.

The printed board 43 is fixedly mounted by screws to an arm portion 42a extending in the Y1 direction of the front member 42. The case retention/slider members 45, 46 are ladder-shaped, and have a width W.

Figure 8:
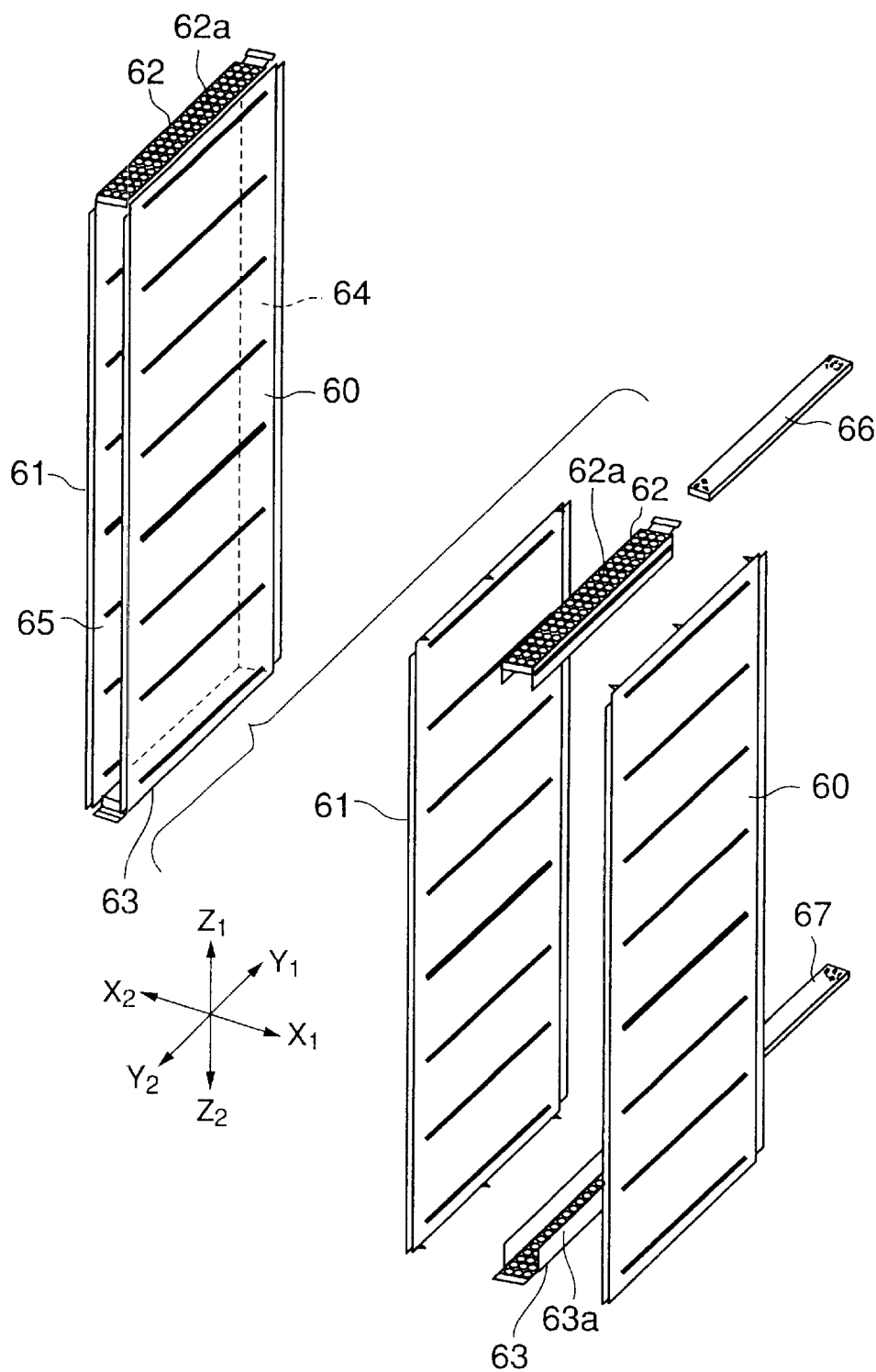
FIG. 8 is a diagram showing a construction of a case.

The case 41, as shown together with FIG. 8, is a flattened tube extending in the direction of the Z axis, and comprises two side panels 60, 61, a top panel 62 and a bottom panel 63. The Y1 side and the Y2 side are flattened rectangular openings 64, 65 extending along the Z axis. The side panels 60, 61, the top panel 62, and the bottom panel 63 are all made of aluminum sheets.

A multiplicity of ventilation holes 62a, 63a are formed in the top panel 62 and the bottom panel 63. The ventilation holes 62a, 63a are formed to a size (diameter d10) and are arranged so as to be capable of limiting the emission of electromagnetic waves. These ventilation holes 62a, 63a function as exits and entrances for the flow of air.

Additionally, electromagnetic wave emissions limiting filters 66, 67 are installed on a bottom surface of the top panel 62 and on a top surface of the bottom panel 63a. The filters 66, 67 may be installed as necessary.

The case 41 is inserted in the Y2 direction from the connector 44 of the plug-in unit main body 40, fixedly mounted at top and bottom sides by the case retention/slider members 45, 46 so as to be mounted on a rear surface of the front member 42, enveloping the entire printed board 43. The connector 44 is exposed from the opening 64 in the case 41.

FIGS. 9(A) and 9(B) show the double-width plug-in unit 16-5. The double-width plug-in unit 16-5 has two printed boards 43 fixedly mounted on a front member 70 of width 2W, with a case 41 on each printed board 43.

[Brief Description of the Installation of the Plug-In Unit 16]

The plug-in unit 16 is installed by moving the card lever members 49, 50 to a horizontal position, inserting the plug-in unit 16 so that the upper and lower case retention/support members 45, 46 align with the guide rails 30a on the bottom panel 30 and the top panel 31 and the guide rails 22a, 22b of the intermediate guide rail member 22 (see FIG. 25(B)), and then finally rotating the card lever members 49, 50 to a vertical position.

The plug-in unit 16 is contained within the sub-rack unit 15, with the connector 44 connected to the connector 37 atop the back wiring board main unit 36. Additionally, the Y1 end of the case 41 contacts adjacent ribs 35b of the back wiring board frame plate 35. The case 41 is electrically connected to the ground via the back wiring board frame plate 35→the sub-rack main unit 17→the rack 11, and acquires the electric potential of the frame ground.

The case 41 and the front member 42 envelope the entire printed board 43, and further, acquire the frame ground electric potential, so the electromagnetic waves radiated from the electronic circuit from the printed board 43 are blocked by the case 41 and the front member 42, limiting the emissions of electromagnetic waves to the outside on a per-plug-in-unit 16 basis. Accordingly, emissions of electromagnetic radiation from the telecommunications apparatus 10 to the outside can be effectively limited. Additionally, the occurrence of mutual electromagnetic wave interference between plug-in units 16 mounted inside the sub-rack unit 15 can be avoided because the emissions of electromagnetic radiation to the outside is limited on a per-plug-in-unit 16 basis.

Additionally, the ground pattern on the printed board 43 is electrically connected to the ground via the connector 44→the connector 37→the ground pattern formed on both sides of the back wiring board 18→the back wiring board frame plate 35→the sub-rack main unit 17→the rack 11, and acquires the electric potential of the frame ground.

Although the printed board 43 as a whole is enveloped by the case 41, in the Z1 direction a space inside the case 41 of the plug-in unit 16 is continuous with a space at the top of the telecommunications apparatus 10 via the filter 66, the multiplicity of holes 62a and the air exchange openings 30c, and in the Z2 direction is continuous with space at the bottom of the telecommunications apparatus 10 via the filter 67, the multiplicity of holes 63a and the air exchange openings 31c. Accordingly, a flow of air flowing in the Z1 direction is securely formed for each individual plug-in unit 16. As a result, the heat of the electronic circuits on the printed board 43 is transported to the outside of the telecommunications apparatus 10 by rising air, thus efficiently cooling the telecommunications apparatus 10.

Additionally, the plug-in unit 16 is moved with great force in the Y2 direction by the rotation of the card lever members 49, 50 to a horizontal position, unplugging and removing the connector 44 from the connector 37. Thereafter, by pulling the plug-in unit 16 in the Y2 direction, the plug-in unit 16 is removed from the sub-rack unit 15.

Next, a description will be given of specific parts of the sub-rack unit 15 and the plug-in unit 16.

[Construction of specific parts of the sub-rack unit 15]

① Structure of the Back Wiring Board 18 and Periphery Thereof

As shown in FIGS. 10(A) and 10(B), the Y1 side of the quadrilateral frame part 35a of the back wiring board frame plate 35 forms a shallow concavity, having a concave portion 35a1 and an edge portion 35a2. As shown in FIG. 10A, the back wiring board main unit 36 engages the concave portion 35a1, and similarly, is pressed into the concave portion 35a1 from the Y1 direction by the frame 19a of the back wiring board warp preventing frame plate 19. The back wiring board main unit 36 fits within the concave portion 35a1, such that an edge portion 36a of the back wiring board main unit 36 is surrounded and enclosed by the edge portion 35a2 of the quadrilateral frame part 35a of the back wiring board frame plate 35 and the frame 19a of the back wiring board warp preventing frame plate 19. Accordingly, emissions of electromagnetic waves from the edge portion 36a of the back wiring board main unit 36 to the outside of the telecommunications apparatus 10 can be effectively limited.

The back wiring board main unit 36, as shown in FIG. 10(A), is squeezed and screwed so as to be reinforced at a plurality of scattered points by the multiplicity of ribs 35b of the back wiring board frame plate 35 and by the plurality of vertical slats 19b of the back wiring board warp preventing frame plate 19.

Accordingly, the tendency of the back wiring board main unit 36 to deform into a convex shape in the Y1 and Y2 directions is restricted by the multiplicity of ribs 35b of the back wiring board frame plate 35 and by the plurality of vertical slats 19b of the back wiring board warp preventing frame plate 19. As a result, the back wiring board main unit 36 can be prevented from bending both when inserting the plug-in unit 16 and when removing the plug-in unit 16.

② Mounting Structure for the Intermediate Guide Rail Member 22

Figure 11:
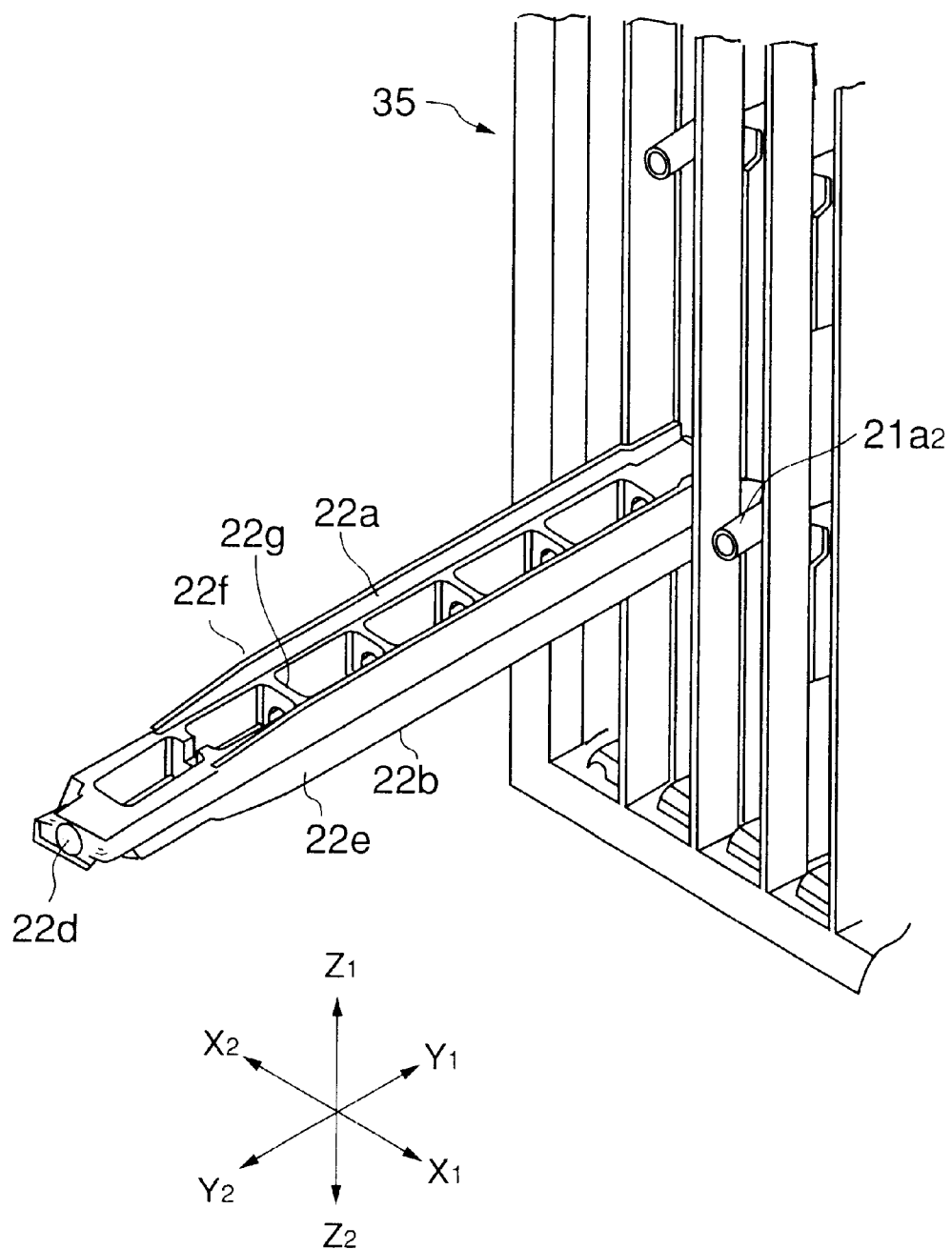
FIG. 11 is a perspective view of a state of installation of an intermediate guide rail member.
Figure 12:
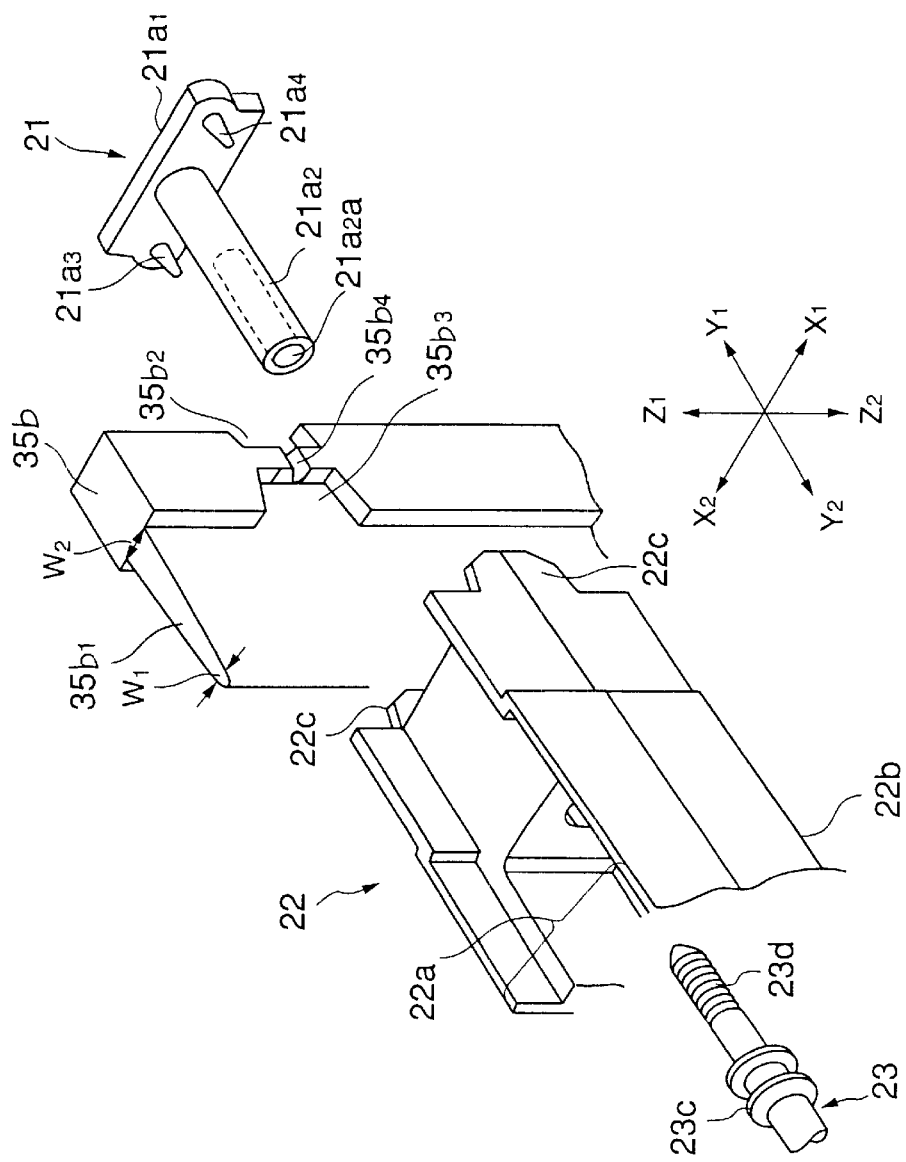
FIG. 12 is an exploded perspective view of a mounting portion of an intermediate guide rail member.

As shown in FIG. 11 and FIG. 12, a rib portion 35b1 exists wherein a width W1 of the Y2 end of the ribs 35b of the back wiring board frame plate 35 is narrower than a width w2 at the Y1 end of the ribs 35b. Each rib 35b has a notch 35b2 cut into the Y1 end surface thereof at regular intervals of heights ¼ H, ½ H and 3/H, H being the height of the back wiring board frame plate 35, and on the X1 and X2 sides a groove 35b4 and a concavity 35b3 that tapers so as to narrow toward the Y1 end.

As shown in FIG. 12, the lock nut member 21 has a long, narrow base portion 21a1 extending in the X1, X2 direction, a lock nut portion 21a2 that projects in the Y1 direction from the center of the base 21a1, and two pins 21a3, 21a4 that extend in the Y1 direction from either end of the base 21a1 and are positioned diagonally from each other. Reference number 21a2a is a thread portion.

The lock nut member 21, as shown in FIGS. 13(A) through 13(D), engages the notches 35b2 at both ends of the base 21a1, the pins 21a3 and 21a4 engage the groove 35b4, the base 21a1 straddles adjacent ribs 35b and cuts across slots 35c, a back surface of the base 21a1 is covered by the back wiring board 36 so that the base 21a1 does not separate from the notches 35b2, and further, the lock nut portion 21a2 projects into the interior of the slot 35c in the Y1 direction, and in that state is pre-mounted at a position at which the intermediate guide rail member 22 is expected to be mounted in the future.

Figure 14:
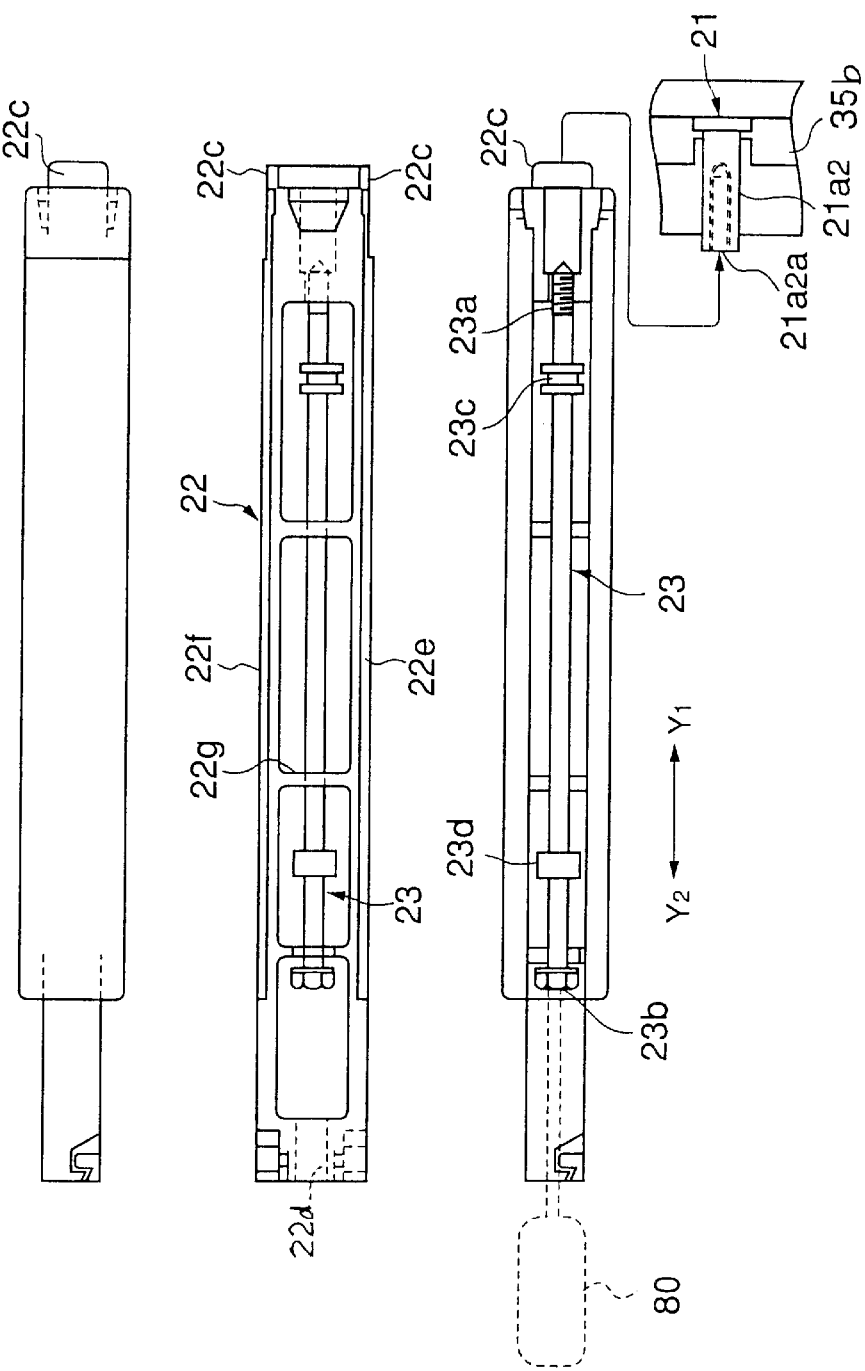
FIG. 14 is a diagram illustrating an intermediate guide rail member and method of mounting.

The intermediate guide rail member 22, as shown in FIGS. 12 through 14, has convex parts 22c extending in the Y2 direction from the X1, X2 ends. These convex parts 22c are shaped so as to correspond to the above-described concavities 35b3. A hole 22d is formed in the Y1 end of the intermediate guide rail member 22 for the purpose of inserting a tip portion of a screwdriver 80.

The lock bolt member 23, as shown in FIGS. 14(B) and 14(C), is long, and supported within the intermediate guide rail member 22. The lock bolt member 23 has a screw portion 23a at the Y1 end, a groove 23b for a screwdriver at the Y2 end, a shield 23c near the screw portion 23a and a shield 23d near the Y2 end.

As shown in FIG. 14C, the intermediate guide rail member 22 is inserted into the sub-rack unit 15 from the Y2 side, with the convex parts 22c fitted into the interior of the concavity 35b3, and similarly, the tip of the screwdriver 60 is inserted into the hole 22d from the Y2 side so as to screw the lock bolt member 23 and thus screw the screw 23a into the thread portion 21a2, so that, as shown in FIG. 13B, the shield 23c presses a surface 22d of the intermediate guide rail member 22 so that the intermediate guide rail member 22 and the lock bolt member 23 pinch the ribs 35b, thus being mounted so as to project in the Y2 direction from the back wiring board frame plate 35 as shown in FIG. 11. In other words, the intermediate guide rail member 22 is inserted from the front of the sub-rack unit 15, and similarly, the lock bolt member 23 is tightened from the front of the sub-rack unit 15, thus making the mounting operation easy.

Additionally, as shown in an expanded view in FIG. 13(B), a gap exists between the tips of the convex parts 22c and an interior of the concavity 35b3, so a force with which intermediate guide rail member 22 and the lock bolt member 23 pinch the ribs 35b is used effectively, and further, the tapered convexities 22c tightly engage the tapered concavity 35b3. Accordingly, the intermediate guide rail member 22 is securely mounted to the back wiring board frame plate 35.

Additionally, the intermediate guide rail member 22, as shown in FIG. 11 and FIG. 14, has beam portions 22e, 22f positioned at both X1, X2 sides and having a wide width in the Z1, Z2 direction, and a plurality of slats 22g connecting the beam portions 22e, 22f at a plurality of points dispersed in the Y1, Y2 direction, and thus has high mechanical strength.

The slots 35c narrow toward the Y1 direction, that is, toward the interior.

[Construction of Specific Parts of the Plug-In Unit 16]

① Mechanisms Relating to the Printed Board 43

Figure 16:
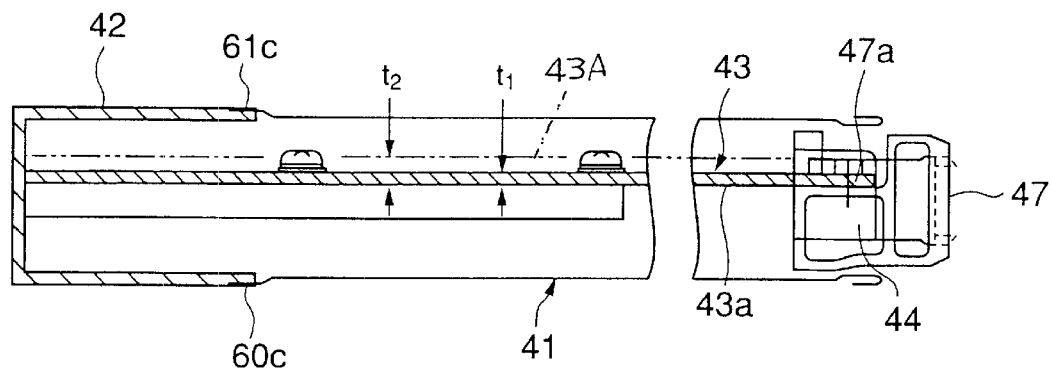
FIG. 16 is a diagram showing an upper portion of a plug-in unit together with a printed board.
Figure 16:
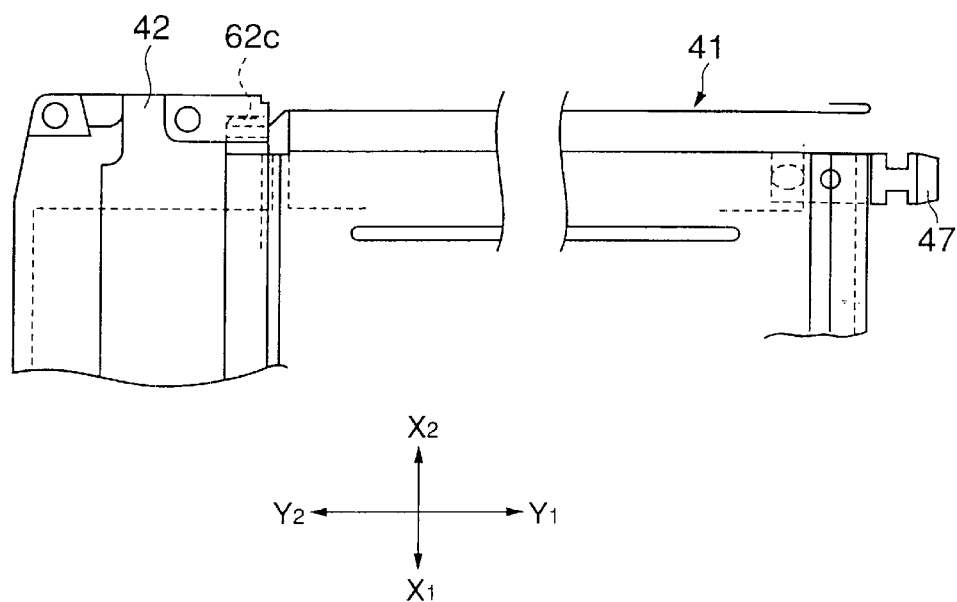
Figure 17:
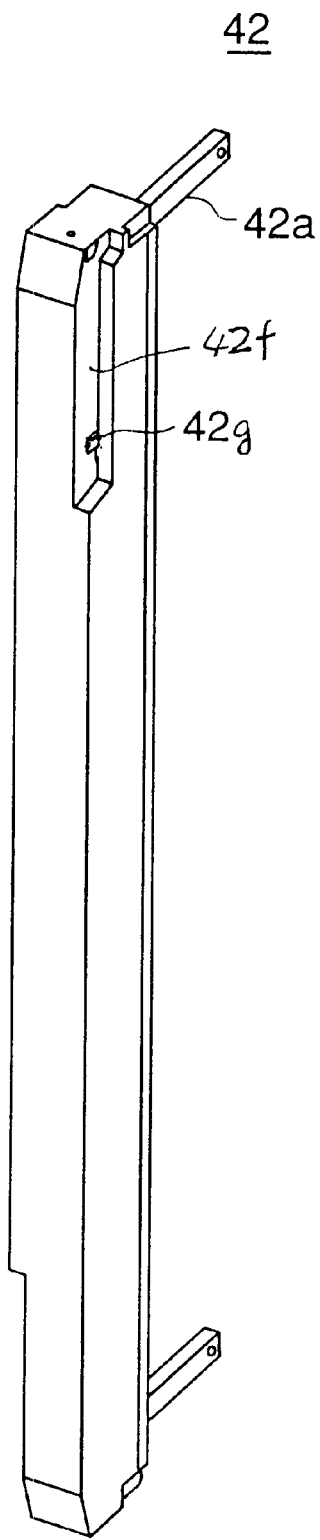
FIG. 17 is a perspective view of a front member.
Figure 17:
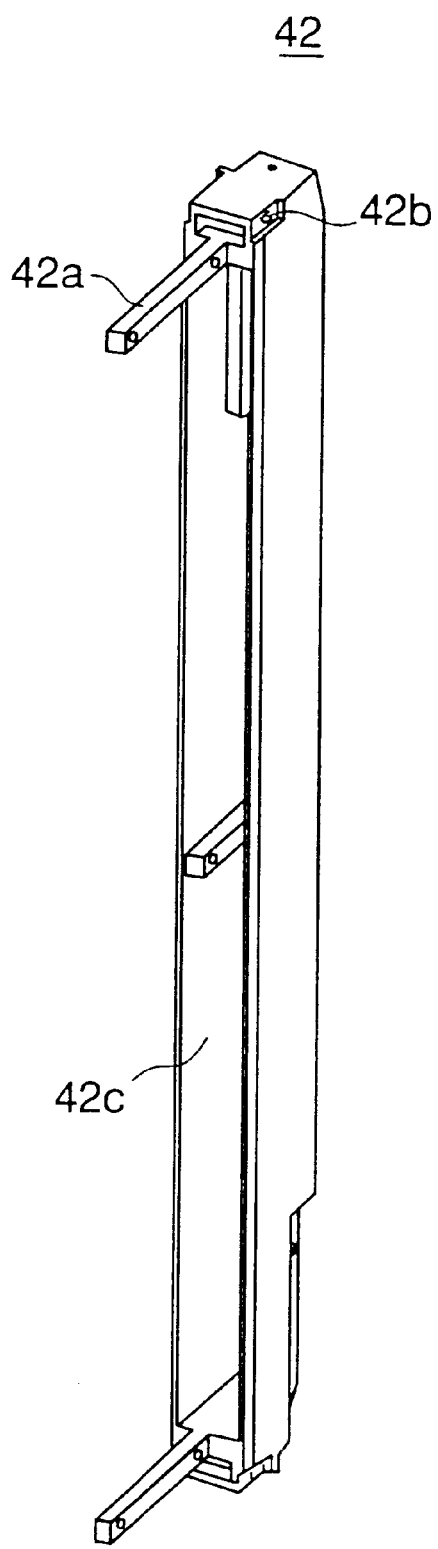
Figure 18:
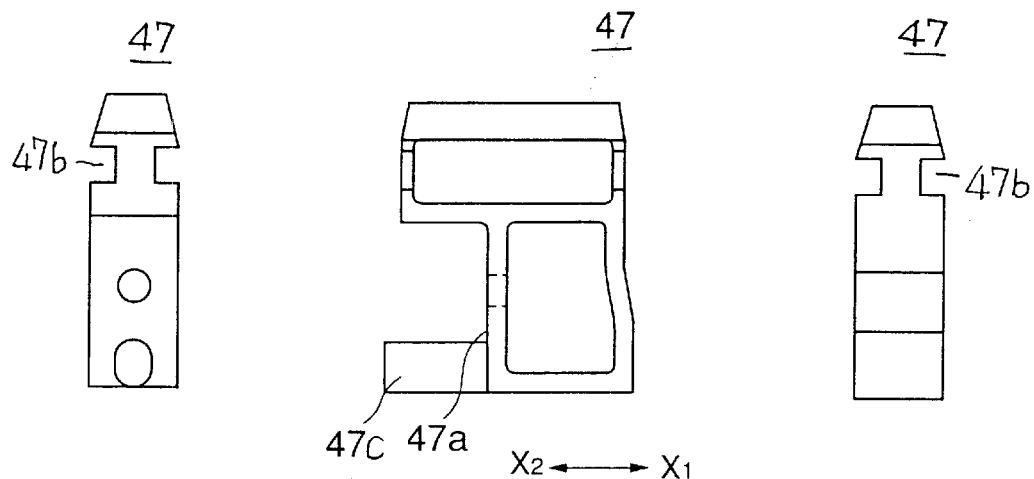
FIG. 18 is a diagram showing a case supporting member.
Figure 18:
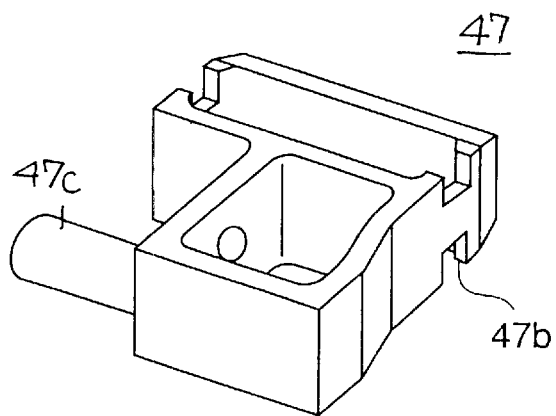
Figure 19:
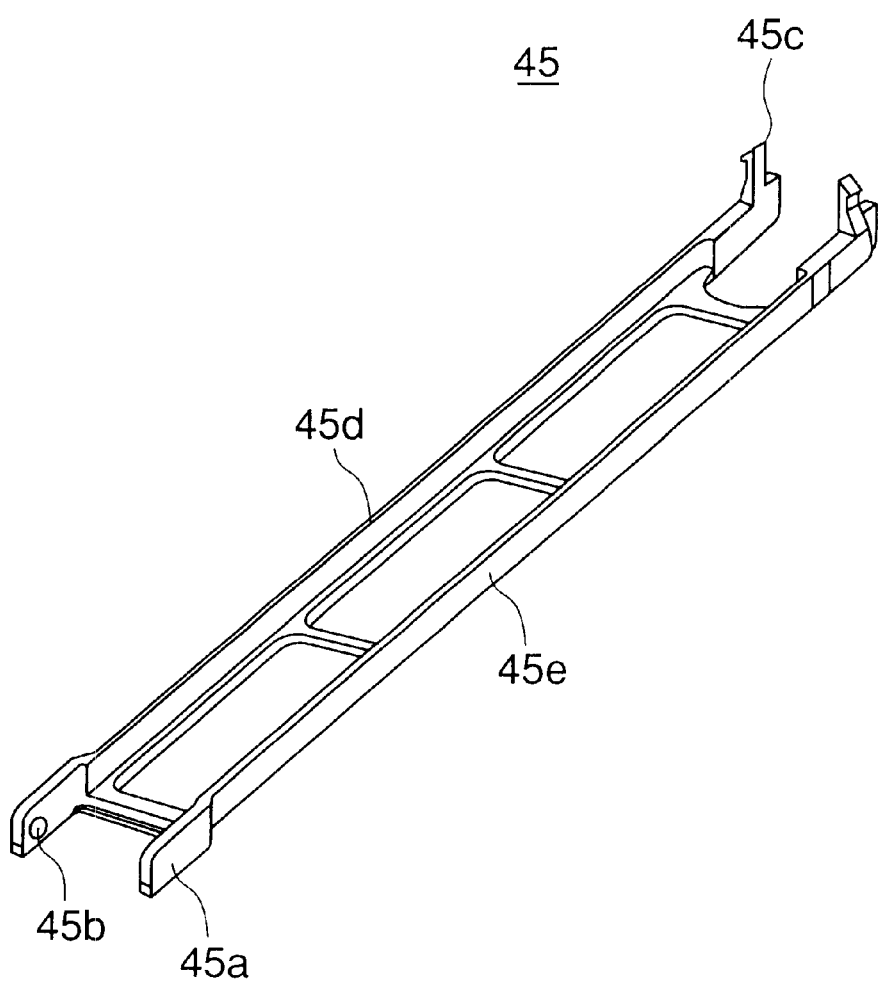
FIG. 19 is a diagram showing a case retention/slider member.

As shown in FIGS. 16(A) and 16(B), the front member 42 shown in FIGS. 17(A) and 17(B), the case supporting members 47, 48 shown in FIGS. 18(A) through 18(D) and the connector 44 are all provided on the same surface of the printed board 43. That is, the arm portion 42a of the front member 42 contacts and is screwed to an X1 surface 43a of the printed board 43. A surface 47a of the case supporting members 47 (48) contacts and is mounted on the same X1 surface 43a of the printed board 43. The connector 44 is mounted atop the surface 47a. The front member 42 and the case supporting members 47 (48) and the connector 44 are aligned in the Y1, Y2 direction. Additionally, the case retention/slider member 45 shown in FIG. 19 is provided so as to straddle a space between the front member 42 and the case supporting member 47. For convenience of illustration, FIG. 19 shows the case retention/slider members 45 mounted in reverse.

Accordingly, even in a case in which a large number of layers of printed boards 43a having a thickness t2 greater than a thickness t1 is used as the printed board, the alignment relation in the Y1, Y2 direction of the front member 42, the case supporting members 47 (48) and the connector 44 is maintained exactly as shown by the double-dotted-and-dashed line in FIG. 16(A), and further, the position of the case retention/slider member 45 with respect to the surface 43a of the printed board 43 does not change. Accordingly, even when using a printed board with a thickness greater than t1, the plug-in unit 16 is loaded correctly. As a result, it is possible to use a printed board of an arbitrary thickness as the printed board 43.

② Mechanisms Relating to the Case Retention/Slider Member 45

The synthetic resin case retention/slider member 45 shown in FIG. 19 is rotatable so that a tip moves in the Z1 direction because a basal fork 45a sandwiches the front member and inwardly projecting opposed convexities 45b engage concavities 42b in the front member 42. Two hooks 45c at the tips of the case retention/slider member 45 engage so as to sandwich the case supporting member 47, and further, are retained by a concavity 47b and held. Thus, the tips of the case retention/slider member 45 are fixedly mounted on the case supporting member 47, so slider portions 45d, 45e on the X1, X2 sides of the ladder-shaped case retention/slider member 45 are securely held parallel to the printed board 43.

Figure 15:
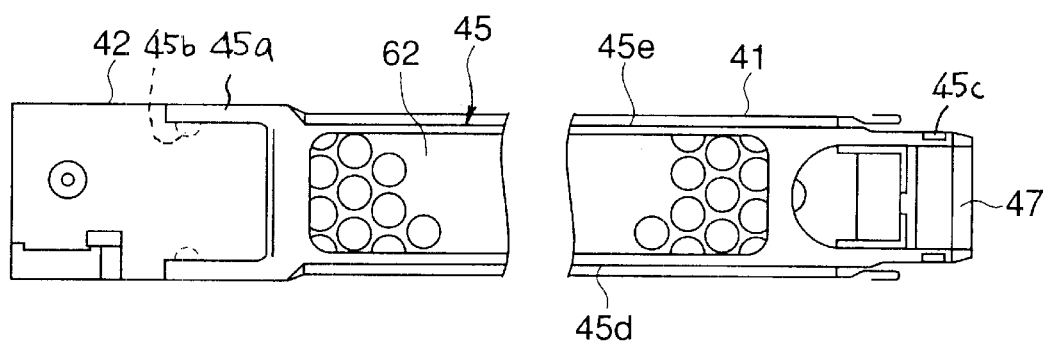
FIG. 15 is a diagram showing an upper portion of a plug-in unit.
Figure 15:
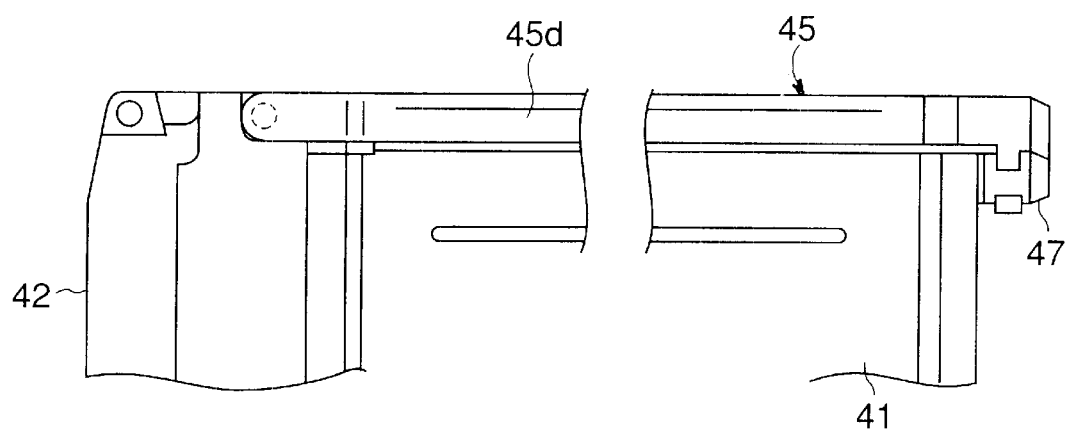

Additionally, as shown in FIGS. 15(A) and 15(B), the slider portions 45d, 45e are positioned on the outside of the case 41 and engage the X1 and X2 sides of a top edge of the case 41 so as to retain the case 41. The hooks 45c retained by the concavity 47b are prevented from coming loose in the Y1 direction from the plug-in unit main body 40 of the case 41.

Accordingly, in the process of loading the plug-in unit 16 into the sub-rack unit 15, the slider portions 45d, 45e are stably guided along the guide rails 30a, 22a, 22b.

Additionally, if the hooks 45c are released and the case retention/slider member 45 is rotated vertically, the case 41 can be pulled in the Y1 direction and removed. Even with the case 41 removed, the hooks 45c of the case retention/slider member 45 are retained by the case supporting members 47 and fixedly mounted, and the slider portions 45d, 45e are guided by the guide rail 30a. Accordingly, even with the case 41 removed, in other words, even with the plug-in unit main body 40 in the state shown in FIG. 7, the plug-in unit 16 can be loaded into the sub-rack unit 15. Loading in such a state can be handy when, for example, a probe is used to contact the electronic circuits of the plug-in unit so as to test the electronic circuits of the plug-in unit 16.

③ Mechanisms Relating to the Case Supporting Members 47

The case supporting members 47 are positioned inside the opening 64 in the case 41, and support the case 41 so that the case 41 does not deform and get crushed. In FIG. 18, a pole 47c that projects from the surface 47a in the X2 direction supports an inner surface of the inner side panel 61 of the case 41.

④ Mechanisms Relating to the Front Member 42

As shown in FIG. 5(A), viewed from a lateral surface of the front member 42, the card lever member 49 is positioned at a position in the Z1 direction on the X1 side and the card lever member 50 is positioned at a position in the Z2 direction on the X2 side. In other words, the card lever members 49, 50, when viewed from the front, are positioned along the diagonal line 51. Accordingly, when both card lever members 49, 50 are operated at the same time, a force F is generated at corners P1, P2 of the diagonal line 51, the combination of the two forces 2xF acting on a position P0 at a center of a height direction and a width direction of the front member 42. Accordingly, an initial stage in the removal of the plug-in units 16, 16-5 is carried out smoothly as compared to a case in which force is exerted on a position on the X2 surface of the front member 42.

Figure 9:
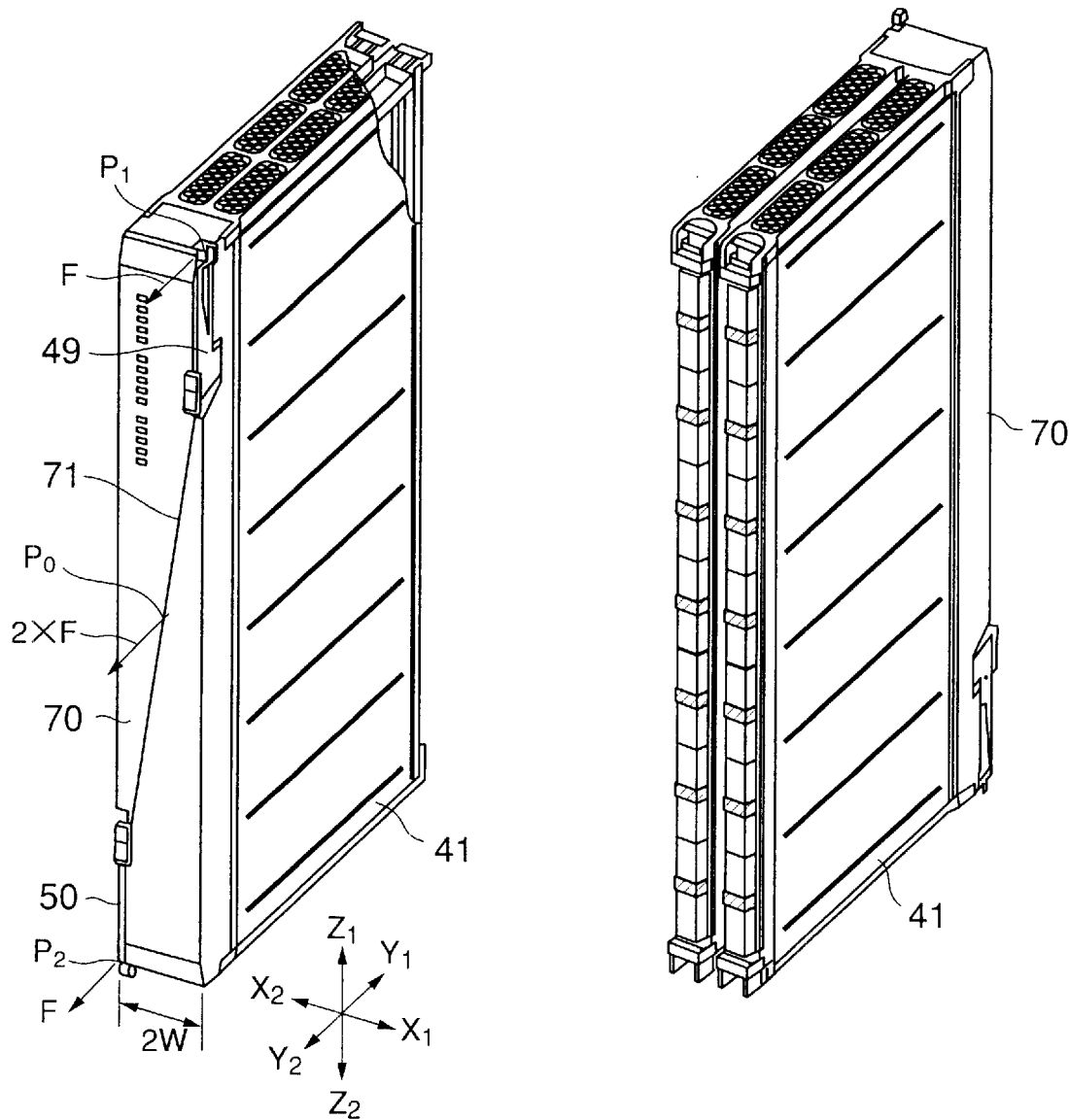
FIG. 9 is a diagram showing a state in which the plug-in unit is loaded into place.

With the double-width plug-in unit 16-5 of FIG. 9, the card lever members 49, 50, when viewed from the front, are positioned along a diagonal line 71. Accordingly, when both card lever members 49, 50 are operated at the same time, a force F is generated at corner positions P1, P2 on the diagonal line 71 within the front member 72, the combination of the two forces 2xF acting on a position P0 at a center of a height direction and a width direction of the front member 42. Accordingly, an initial stage in the removal of the plug-in units 16, 16-5 is carried out smoothly as compared to a case in which force is exerted on a position on the X2 surface of the front member 42. This effect is particularly pronounced in the case of the double-width plug-in units 16-5.

Additionally, the front member 42, as shown in FIG. 17(B), has a box-like opening 42c in a rear surface thereof, and, as shown in FIG. 16, contains a part of the Y2 end of the printed board 43.

⑤ The Structure of the Card Lever Members 49 (50)

Figure 21:
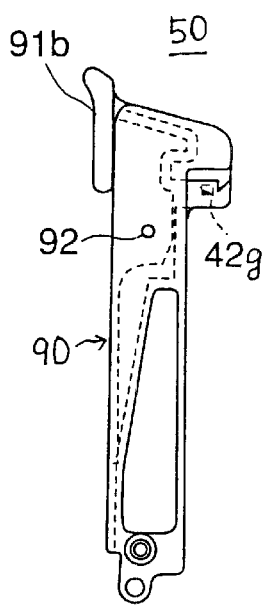
FIG. 21 is a diagram of a construction of a card lever member.
Figure 21:
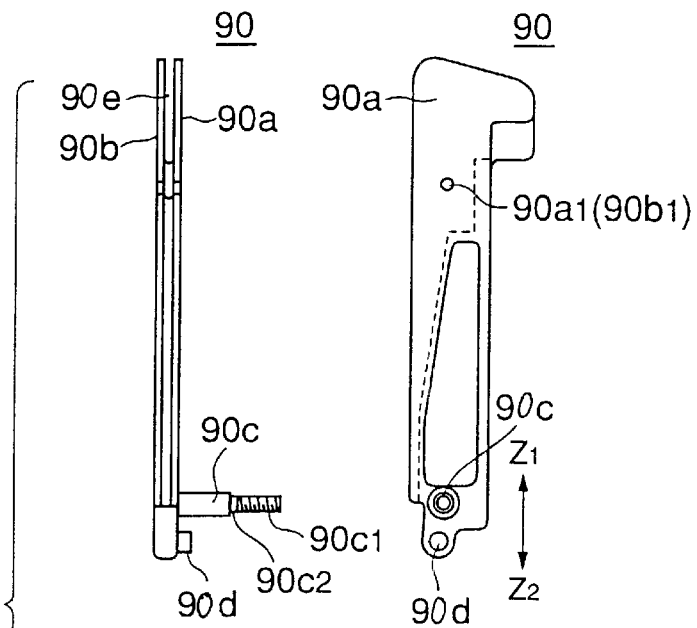
Figure 21:
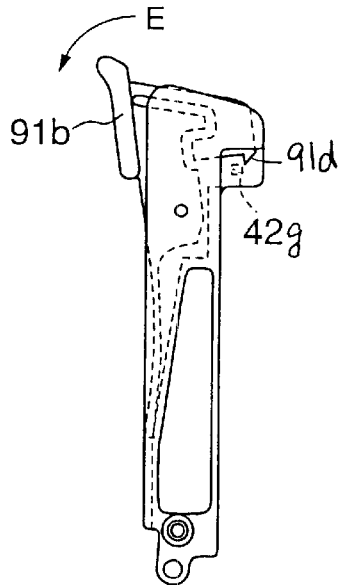
Figure 21:
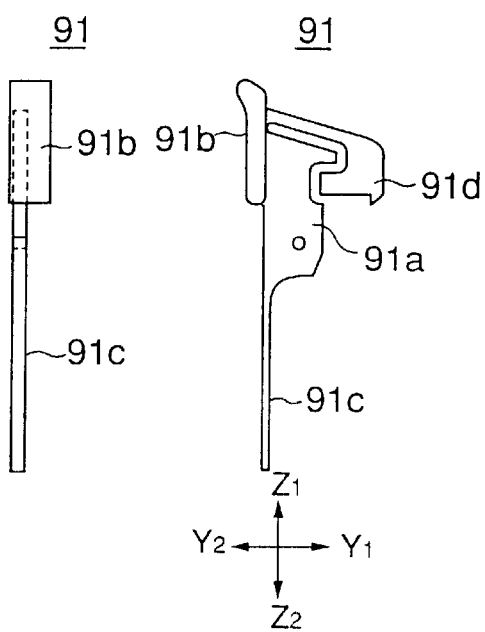

The car lever member 50, as shown in FIG. 21A, comprises a synthetic resin auxiliary lever 91 mounted on an aluminum die-cast card lever main body 90.

The card lever main body 90, as shown in FIGS. 21(B) and 21(C), comprises two adjacent panels 90a and 90b, a pivot shaft 90c at the Z2 end, and a projection 90d adjacent to the pivot shaft 90c. A flat space 90e is formed in between the panels 90a and 90b. Holes 90a1 and 90b1 are formed in the panels 90a and 90b. The pivot shaft 90c has a screw portion 90c1 at a tip thereof and a constricted portion 90c2 at an intermediate part thereof. The shaft 90c is aluminum die cast and formed as a single integrated unit with the panels 90a, 90b, and is stronger than a case in which the shaft is formed as a separate member.

The auxiliary lever 91, as shown in FIGS. 21(B) and 21(C), comprise a main body 91a, a knob 91b at a tip of the main body 91a, an arm 91c extending from the main body 91a and a hook 91d extending from the knob 91b.

The auxiliary lever 91 is constructed so that the knob 91b projects outside the card lever main body 90, and the main body 91a, arm 91c and hook 91d are contained within the flat space 90e, with the pin 92d mounted on the card lever main body 90. The auxiliary lever 91 rotates in unison with the card lever main body 90, and is rotatable in a direction of an arrow E within a small angular range with respect to the card lever main unit 90 because the arm 91c bends elastically as shown in FIG. 21(F). When the auxiliary lever 91 rotates independently with respect to the card lever main unit 90, the hook 91d moves.

Figure 20:
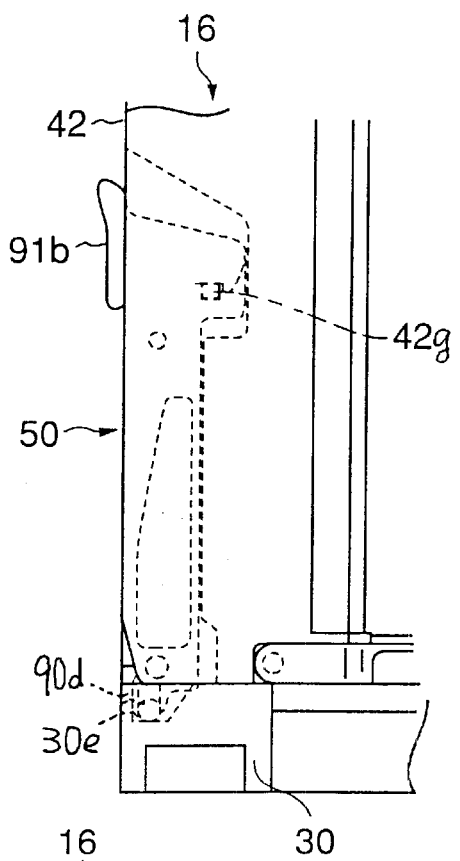
FIG. 20 is a diagram illustrating a card lever member rotation operation in a final step of mounting a plug-in unit and in an initial step of pulling out a plug-in unit.
Figure 20:
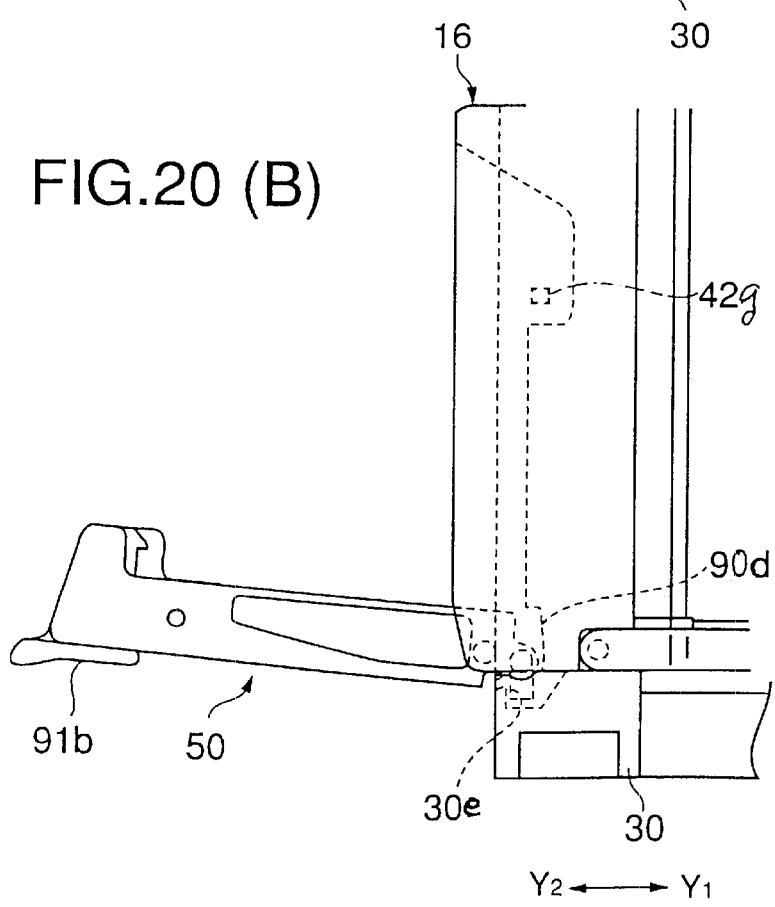
Figure 22:
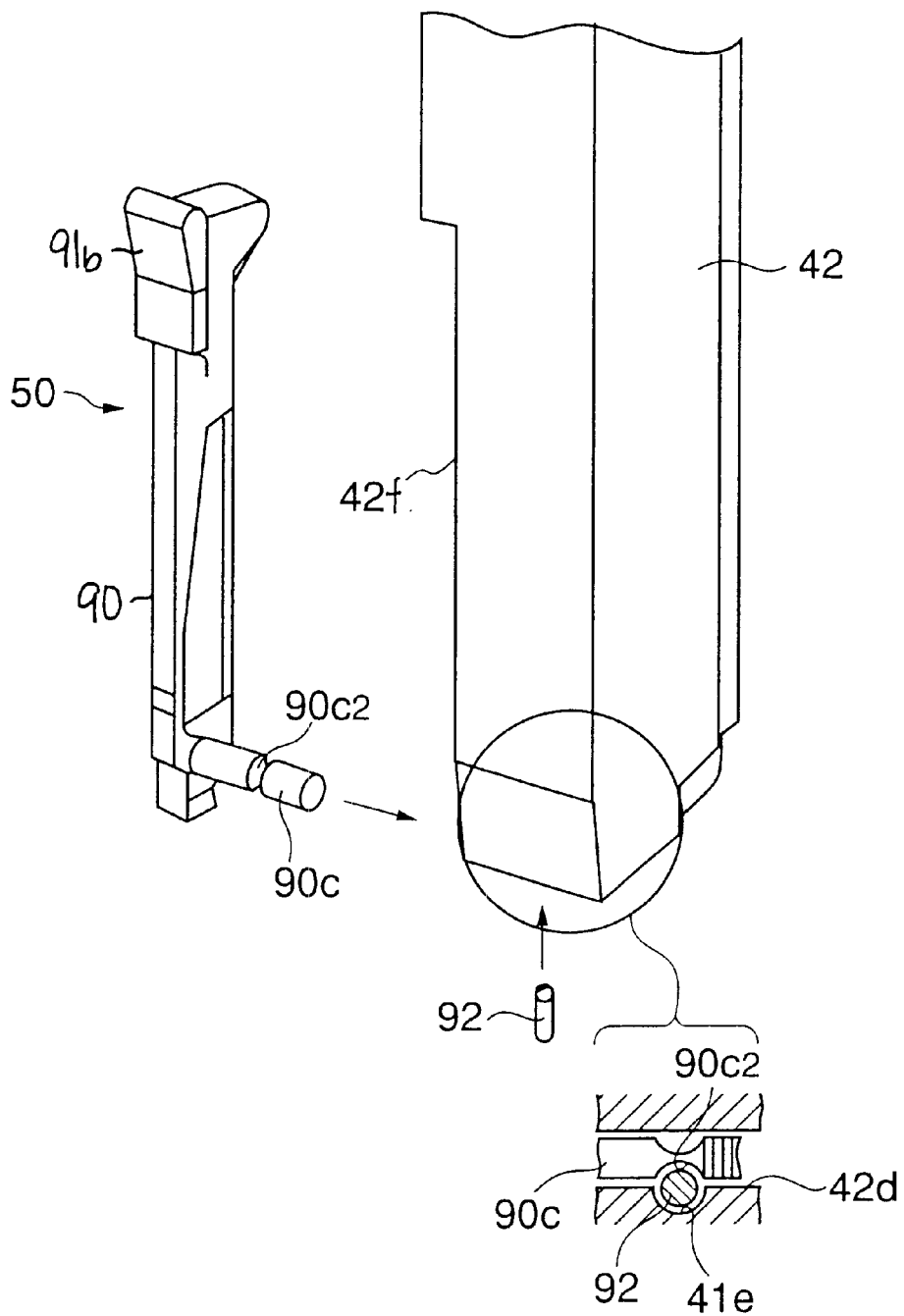
FIG. 22 is a diagram illustrating mounting of a card lever member on a front member.

The card lever member 50, as shown in FIG. 20, is such that the pivot shaft 90c is supported on the front member 42 and the card lever member 50 is contained and mounted within a card lever member containment concavity 42f in a side surface of the front member 42. The mounting, as shown in FIG. 22, is effected by inserting the pivot shaft 90c inside a horizontal hole 42d in the front member 42 and pressing the pin 92 into the vertical hole 42e in the Z2 surface of the front member 42. The pin 92 engages the constricted portion 90c2 so as to prevent the pivot shaft 90c from coming out of the front member 42.

When the plug-in unit 16 is mounted, the final stage of the process involves rotating the card lever member 49 90 degrees in a clockwise direction from the state shown in FIG. 20(B). At this time, the projection 90d presses against a concave bearing part 30e of the bottom panel 30 and the plug-in unit 16 is moved forcefully in the Y1 direction to attain the state shown in FIG. 20A.

The step of moving the card lever member 49 to a vertical position from the start involves pressing the knob 91b in the Y1 direction with the tip of a finger. The hook 91d elastically deforms, passes over a retaining projection 42g in the front member 42, is retained by the retaining projection 42g and the card lever member 42g is locked in the position shown in FIG. 20(A).

When the card lever member 49 is rotated in a counter-clockwise direction from the state shown in FIG. 20(A), the knob 91b is hooked by a fingertip and pulled in the Y2 direction. By this operation, as shown in FIG. 21F the auxiliary lever 91 is rotated together with the elastic bending of the arm 91c, the hook 91d is released from the retaining member 42g and the lock is unlocked. Next, the rotation of the card lever main body 90 in the counter-clockwise direction commences. At this time, the projection 90d presses against the concave bearing part 30e of the bottom panel 30 and the plug-in unit 16 is moved forcefully in the Y2 direction to attain the state shown in FIG. 20A.

As described above, lock as well as unlock are performed as the card lever member 49 is rotated and thus there is no need for a special operation solely to lock, or a special operation solely to unlock, making operation easy.

⑥ The structure of the case 41

Figure 23:
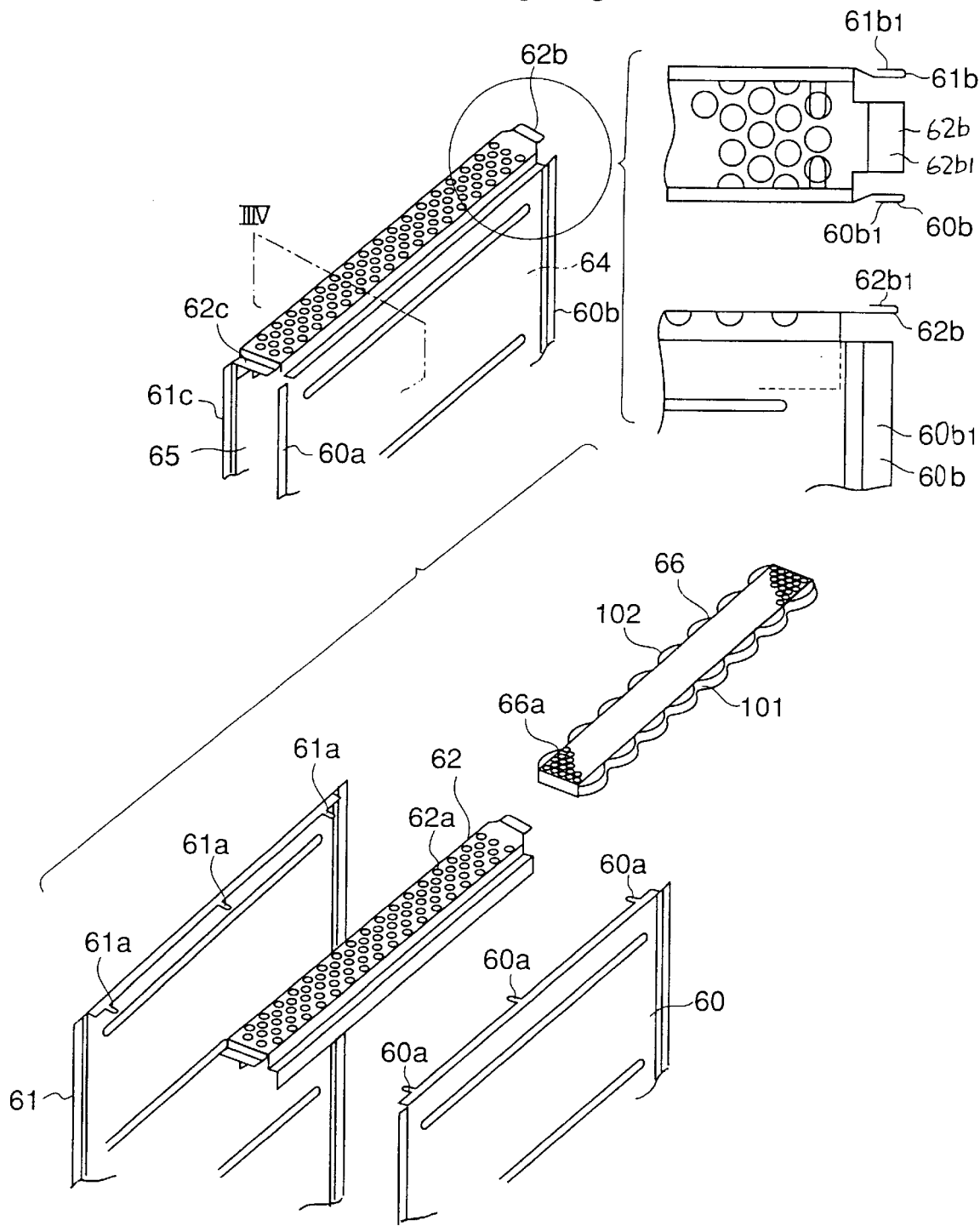
FIG. 23 is a diagram showing a construction of a case cover periphery.
Figure 24:
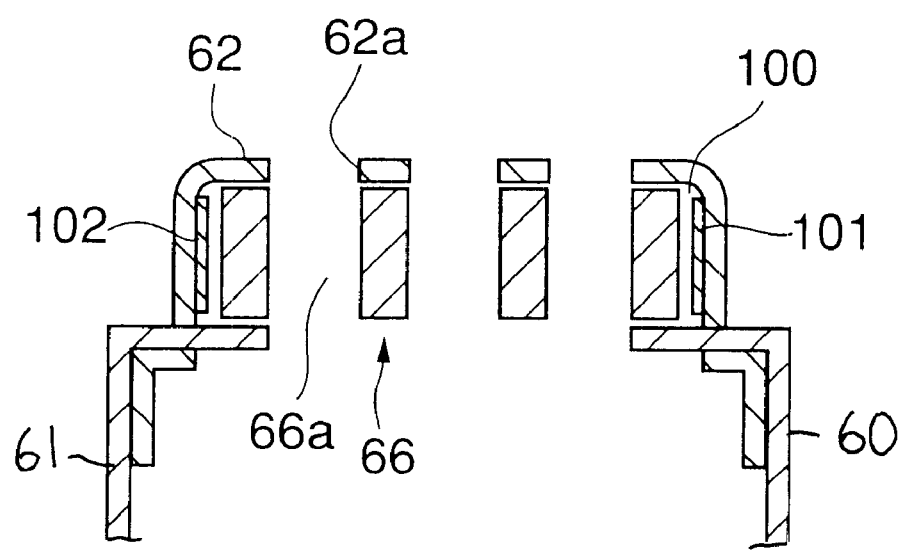
FIG. 24 is a expanded cross-section along a surface IIIV [sic] in FIG. 23.

As shown in FIGS. 23 and 24, a space 100 for inserting the filters is formed between the bottom surface of the top panel 62 and the tongue-like supporting tabs 60a, 61a of the two side panels 60, 61. Inside this space 100 the electromagnetic wave emissions restraint filter 66 is inserted so as to be supported by the support tabs 60a, 61a. The filter 66 is made of aluminum and, as shown in FIG. 24, ventilation holes 66a are formed in the same layout as the ventilation holes 62a in the top panel 62 and the bottom panel 63, with a thickness t10 being greater than a diameter d10 of the holes 66a such that t10>d10. In a state in which the filter 66 is inserted, the position of the ventilation holes 66a matches the position of the ventilation holes 62a. Since t10>d10, emissions of even high-frequency electromagnetic waves can be effectively prevented.

Additionally, filter 66 has wave-shaped leaf springs 101, 102 on both lateral surfaces thereof. With the filter 66 inserted inside the above-described space 100, as shown in FIG. 23 the leaf springs 101, 102 elastically contact an inner surface of the case 41 and the filter 66 is put into a state in which the filter 66 is securely electrically connected to the case 41. Accordingly, in a state in which the plug-in unit 16 is loaded inside the sub-rack 15, the filter 66 securely acquires the ground potential and functions to limit emissions of high-frequency electromagnetic waves.

Additionally, the above-described construction is the same for the electromagnetic wave emissions restraint filter 67 on the bottom panel 63.

Additionally, as shown in an enlarged view in FIG. 23, edges 62b, 60b and 61b of the top panel 62 and side panels 60, 61 that face the opening 64 have curl portions 62b1, 60b1 and 61b1 bent back toward the outside. The existence of these curl portions 62b1, 60b1 and 61b1 gives the edge portions 62b, 60b and 61b good spring capabilities. This construction is the same for the edge of the bottom panel 63 and the edges 62c, 60c and 61c that face the opening 65.

As shown in FIG. 16, the case 41 and the front member 42 are in a state of elastic and firm contact with each other, in a state in which the edges 62c, 60c and 61c facing the opening 65 in the case 41 are elastically bent. Accordingly, the case 41 and the front member 42 are in a state of secure electrical connection with each other over the entire periphery thereof.

[Specific Parts of the Plug-In Unit 16 in a Loaded State]

Figure 26A:
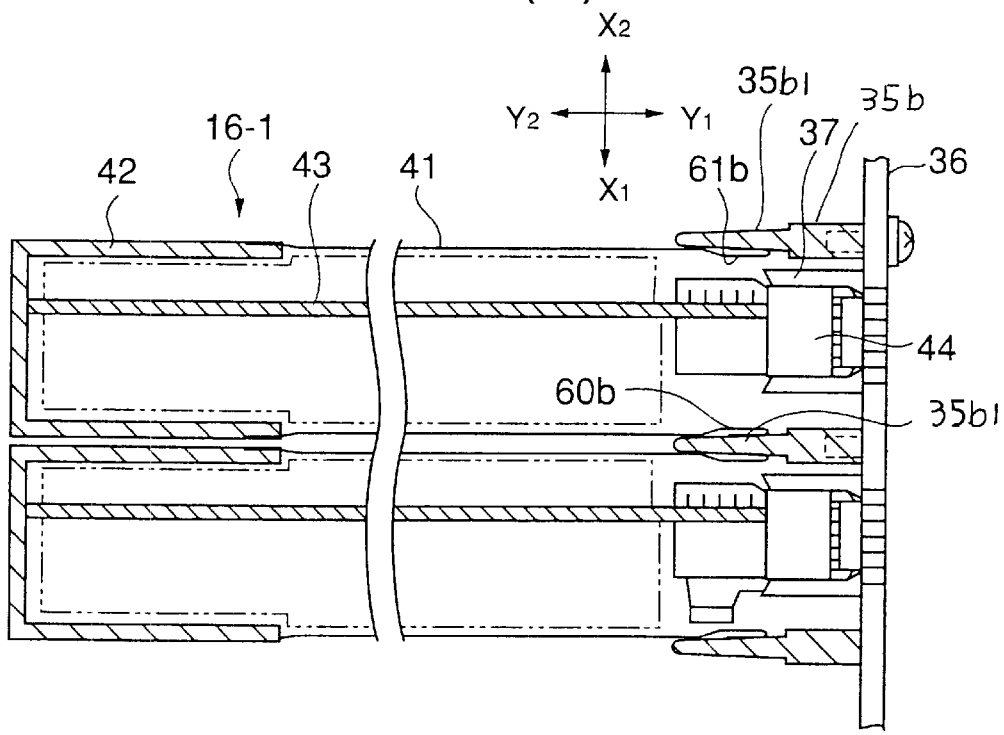
FIG. 26 is a diagram showing a state in which the plug-in unit has been mounted.
Figure 26B:
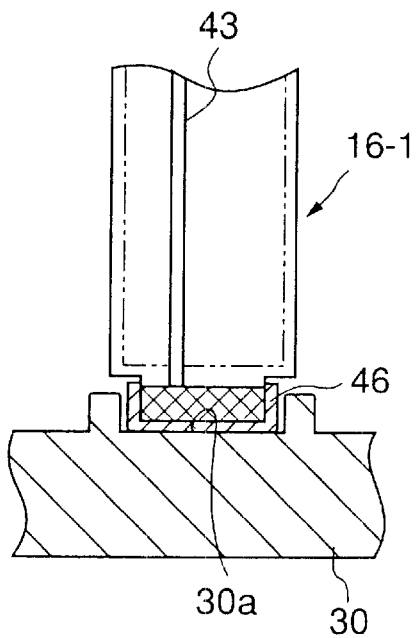
Figure 26C:
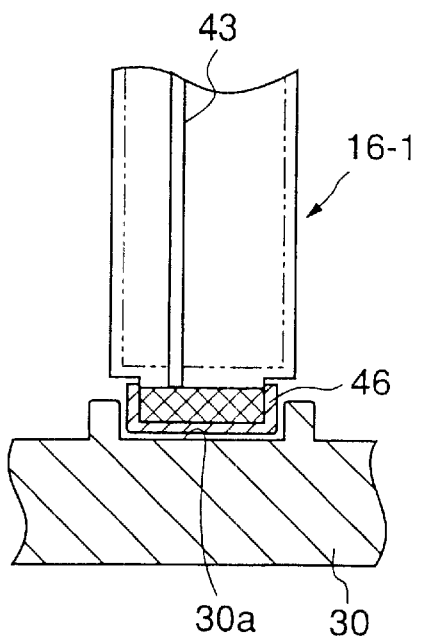

FIGS. 26(A) and 26(C) show a state in which the plug-in unit 16 is loaded into the sub-rack 15. As shown in FIG. 26A, edges 60b and 61b that face the opening 64 of the case 41 contact adjacent ribs 35b of the back wiring board frame plate 35. Since the edges 60b and 61b have good spring-like properties and the width of the slots 35c narrows toward the Y1 direction, the edges 60b and 61b elastically and firmly contact rib portions 35b1 of the ribs 35b in a state in which the edges 60b and 61b are elastically bent. The edge 62b of the top panel 62 and the edge of the bottom panel 63 also elastically and firmly contact the insides of the frame plate of the back wiring board frame plate 35 while in a state of being elastically bent. Accordingly, the case 41 and the back wiring board frame plate 35 are securely and firmly in contact with each other over the entire periphery thereof, and further, the electrical connection between the case 41 and the back wiring board frame plate 35 is effected over the entire periphery of the case 41.

Additionally, when the plug-in unit 16 is mounted in the sub-rack unit 15, the position of the plug-in unit 16 is determined by the connection of the connector 44 to the connector 37, and as shown in FIG. 26C, the plug-in unit 16 floats slightly off the guide rail 30a.

[Construction Relating to EMI Countermeasures of the Telecommunications Apparatus]

An organized description will now be given of the construction of the telecommunications apparatus 10 with respect to Emi countermeasures.

The EMI countermeasures of the telecommunications apparatus 10 are effected in the first place by limiting the emissions to the outside of electromagnetic waves from the plug-in units 16, and in the second place by limiting the emissions to the outside of electromagnetic waves from the sub-rack units 15.

The construction employed to limit the emissions to the outside of electromagnetic waves from the plug-in units 16 is as follows:

1. As shown in FIGS. 6 and 26, the aluminum case 41 and the aluminum front member 42 completely enclose the printed board 43.

2. As shown in FIGS. 23 through 25, the ventilation holes 62a, 63a of the top panel 62 and the bottom panel 63 of the case 41 are of a size and an alignment capable of limiting the emissions of electromagnetic waves.

3. As shown in FIGS. 23 through 25, electromagnetic wave emissions limiting filters 66, 67 are installed.

4. As shown in FIG. 26, the entire periphery of the case 41 is firmly attached to the back wiring board frame plate 35.

5. As shown in FIG. 26, the entire periphery of the case 41 is firmly attached to the front member 42.

The construction employed to limit the emissions to the outside of electromagnetic waves from the sub-rack unit 15 is as follows:

1. As shown in FIG. 10, the edge portion 36a of the back wiring board main unit 36 is enclosed and enveloped by the edge portion 35a2 of the quadrilateral frame part 35a of the back wiring board frame plate 35 and the frame 19a of the back wiring board warp preventing frame plate 19.

[Construction Relating to the Flame Resistance of the Telecommunications Apparatus 10]

As shown in FIG. 6 and FIG. 26, for each plug-in unit 16 the aluminum case 41 and the aluminum front member 42 completely enclose the printed board 43. As a result, even if a fire breaks out inside the sub-rack unit 15, the flames are prevented from directly contacting the printed board 43 by the aluminum case 41 and the aluminum front member 42. Accordingly, a fire inside the telecommunications apparatus 10 can be prevented from spreading, giving the telecommunications apparatus 10 a high degree of flame resistance.

[Construction Related to Ease of Expansion of Capabilities of the Telecommunications Apparatus 10]

As can be seen in FIG. 2, the half-height plug-in unit 16-2 has a capability that exceeds an equivalent of 50 percent of the full-height unit 16-1, and the quarter-height plug-in unit 16-3 has a capability that exceeds an equivalent of 50 percent of the half-height plug-in unit 16-2. Accordingly, as shown in FIG. 2(C) substituting two half-height plug-in units 16-2 for the full-height plug-in unit 16-1 shown in FIG. 2(A) amounts to an expansion of capabilities. Additionally, as shown in FIG. 2D substituting four quarter-height plug-in units 16-3 for the two half-height plug-in units 16-2 shown in FIG. 2(C) amounts to a further expansion of capabilities.

As shown in FIGS. 3 and 14, the intermediate guide rail member 22 is inserted from the front of the sub-rack unit 15, and similarly, the operation of tightening the lock bolt member 23 also is performed from the front of the sub-rack unit 15, so mounting can be done with ease. Accordingly, expanding the capabilities of the telecommunications apparatus 10 can be accomplished by working from the front of the sub-rack unit 15.

What is claimed is:

1. A telecommunications apparatus comprising a sub-rack unit having a back wiring board and a guide rail portion and a plurality of plug-in units inserted and loaded into the sub-rack unit from a front surface thereof along the guide rail portion, the plug-in comprising:

a metallic front member;

a printed board fixedly mounted at one edge on the metallic front member and having, at a leading edge in a direction of insertion, a connector designed to be connected to the back wiring board when loaded; and a metallic case that envelopes the printed board and has an opening on a leading edge in a direction of insertion that exposes the connector, the plug-in unit configured so that an edge of the opening on the leading edge in the direction of insertion of the metal case contacts the sub-rack unit in a state in which the plug-in unit is mounted in the sub-rack unit;

wherein at least one intermediate guide rail member is provided so as to divide the internal space of the sub-rack unit and provide a guide rail portion at a predetermined intermediate position of the sub-rack unit along which the plug-in unit is inserted into the sub-rack unit.

2. A telecommunications apparatus comprising a sub-rack unit having a back wiring board and a guide rail portion and a plurality of plug-in units inserted and loaded into the sub-rack unit from a front surface thereof along the guide rail portion, the sub-rack unit configured so as to have a back wiring board frame plate having ribs provided on a front of the back wiring board, the plug-in unit comprising:

a metallic front member;

a printed board fixedly mounted at one edge on the metallic front member and having, at a leading edge in a direction of insertion, a connector designed to be connected to the back wiring board when loaded; and a metallic case that envelopes the printed board and has an opening on a leading edge in a direction of insertion that exposes the connector, the plug-in unit configured so that an entire peripheral edge of the opening on the leading edge in the direction of insertion of the metallic case contacts the back wiring board frame plate ribs in a state in which the plug-in unit is mounted in the sub-rack unit;

wherein at least one intermediate guide rail member is provided so as to divide the internal space of the sub-rack unit and provide a guide rail portion at a predetermined intermediate position of the sub-rack unit along which the plug-in unit is inserted into the sub-rack unit.

3. The telecommunications apparatus as claimed in claim 2, wherein the plug-in unit case has a multiplicity of ventilation holes that are formed in a bottom panel and a top panel thereof, the multiplicity of ventilation holes each having a diameter less than a thickness of the associated top or bottom panel and each being capable of limiting emissions of electromagnetic waves.

4. The telecommunications apparatus as claimed in claim 3, wherein the plug-in unit case includes filters that limit emissions of electromagnetic waves located on a bottom surface of the top panel and a top surface of a bottom panel, the filters having a configuration such that a multiplicity of ventilation holes are formed in the filters, and further, a thickness of the filters being greater than a diameter of the ventilation holes.

5. The telecommunications apparatus as claimed in claim 3, wherein leaf springs are provided on both lateral surfaces of the filters, the leaf springs elastically contacting an inner surface of the case.

6. The telecommunications apparatus as claimed in claim 3, wherein an edge of the plug-in unit case bordering the opening has a portion bent back and to an outside of the case, such bent-back portion having spring.

7. The telecommunications apparatus as claimed in claim 2, wherein:

the plug-in unit further comprises ladder-shaped case retention/slider members on top and bottom sides thereof;

case supporting members are mounted on upper and lower edges of an end in an insertion direction of the printed board; and the case is removable, the case retention/slider members being rotatably supported at one end on top and bottom ends of the front member, leading edges of the case retention/slider members being detachably retained by the case supporting members on top and bottom edges of an end of the printed board in the insertion direction, the case retention/slider members functioning both to pressedly retain the case and to slide atop the guide rail when the plug-in unit is being inserted, such that the case retention/slider members slide atop the guide rail when the plug-in unit is being inserted even when the case is removed.

8. The telecommunications apparatus as claimed in claim 7, wherein the front member, the case supporting member and the connector are mounted on a same surface of the printed board.

9. The telecommunications apparatus as claimed in claim 2, wherein a tip of the ribs of the back wiring board frame plate is narrower than a base of the ribs thereof.

10. The telecommunications apparatus as claimed in claim 2, wherein the sub-rack unit has a quadrilateral frame portion provided at a back surface of the back wiring board frame plate, the quadrilateral frame portion having a concave portion, the back wiring board being mounted in a state in which the back wiring board fits inside the concave portion on the back surface of the quadrilateral frame portion.

11. The telecommunications apparatus as claimed in claim 2, wherein the sub-rack unit further comprises a back wiring board warp preventing frame plate provided on a back surface of the back wiring board, the back wiring board warp preventing frame plate comprising a frame and a plurality of vertical slats and being fixedly mounted on the back wiring board frame plate.

12. The telecommunications apparatus as claimed in claim 2, wherein the sub-rack unit further comprises:

a lock nut member mounted so as to straddle adjacent rib portions on a rear surface of the ribs on the back wiring board frame plate and having a lock nut that projects proximally; and an intermediate guide rail member having guide rails on upper and lower surfaces thereof, with a lock bolt member retained inside and an opening in a tip thereof in which a tool is inserted so as to rotate the lock bolt member, the intermediate guide rail member being inserted into the sub-rack unit from a front surface thereof and mounted by similarly threading the lock bolt member into the lock nut of the lock nut member from the front surface of the sub-rack unit.

13. The telecommunications apparatus as claimed in claim 12, wherein the intermediate guide rail member has tapered convexities on both sides of an end by which the intermediate guide rail member is mounted, the ribs of the back wiring board frame plate having tapered concavities on both sides thereof, the tapered convexities engaging the tapered concavities.

14. The telecommunications apparatus as claimed in claim 12, wherein the intermediate guide rail member has beams at both sides and slats that connect the beams at a plurality of points.

15. The telecommunications apparatus as claimed in claim 2, wherein the card levers are provided on both lateral surfaces of the metallic front member at positions located diagonally opposite each other when viewed from the front.

16. The telecommunications apparatus as claimed in claim 14, wherein:

the card lever comprises a metallic main body and an auxiliary lever made of synthetic resin and mounted on the main body, the auxiliary lever comprising a knob, an arm that bends elastically, and a hook that extends from the knob and engages a retaining portion of the metallic front member.

17. The telecommunications apparatus as claimed in claim 16, wherein the metallic card lever main body comprises a pivot shaft integrated into the main body, the pivot shaft having a constricted portion at an intermediate part thereof, the pivot shaft being inserted into a horizontal hole in the metallic front member and a pin pressed into a vertical hole in the front member engaging the constricted portion.

18. A plug-in unit that is inserted and mounted in a sub-rack unit having a back wiring board and a guide rail, the plug-in unit comprising:

a metallic front member;

a printed board fixedly mounted on the metallic front member and having a connector on an end in a direction of insertion such that, when inserted, the connector is connected to the back wiring board; and a metallic case having an opening that exposes the connector on the end in the insertion direction and that covers so as to envelope the printed board;

wherein the plug-in unit has a size selected from a plurality of ones corresponding to a space in the sub-rack unit, said space being defined by an intermediate guide rail member which provides a guide rail portion at a predetermined internal position of the sub-rack unit along which the plug-in unit is inserted into the sub-rack unit.

19. The plug-in unit as claimed in claim 18, wherein the plug-in unit case has a multiplicity of ventilation holes formed in a bottom panel and a top panel thereof and having a size and an alignment capable of limiting emissions of electromagnetic waves.

20. The plug-in unit as claimed in claim 18, further comprising ladder-shaped case retention/slider members on top and bottom sides thereof, case supporting members being mounted on upper and lower edges of an end in an insertion direction of the printed board, the case being removable, the case retention/slider members being rotatably supported at one end on top and bottom ends of the front member, leading edges of the case retention/slider members being detachably retained by the case supporting members on top and bottom edges of an end of the printed board in the insertion direction, the case retention/slider members functioning both to pressedly retain the case and to slide atop the guide rail when the plug-in unit is being inserted, such that the case retention/slider members slide atop the guide rail when the plug-in unit is being inserted even when the case is removed.

21. The plug-in unit as claimed in claim 20, wherein the front member, the case supporting member and the connector are mounted on a same surface of the printed board.

* * * * *